(12) United States Patent
Yang et al.

(10) Patent No.: US 11,855,071 B2
(45) Date of Patent: Dec. 26, 2023

(54) BCD DEVICE LAYOUT AREA DEFINED BY A DEEP TRENCH ISOLATION STRUCTURE AND METHODS FOR FORMING THE SAME

(71) Applicant: Taiwan Semiconductor Manufacturing Company Limited, Hsinchu (TW)

(72) Inventors: Tsung-Yu Yang, Tainan (TW); Po-Wei Liu, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 13 days.

(21) Appl. No.: 17/480,434

(22) Filed: Sep. 21, 2021

(65) Prior Publication Data

US 2022/0352142 A1 Nov. 3, 2022

Related U.S. Application Data

(60) Provisional application No. 63/180,854, filed on Apr. 28, 2021.

(51) Int. Cl.
*H01L 27/02* (2006.01)
*H01L 21/762* (2006.01)
*H01L 27/06* (2006.01)

(52) U.S. Cl.
CPC .... *H01L 27/0207* (2013.01); *H01L 21/76232* (2013.01); *H01L 27/0623* (2013.01)

(58) Field of Classification Search
CPC ... H01L 21/8222; H01L 21/8248–8249; H01L 27/0259–0262; H01L 27/0623; H01L 27/0635; H01L 27/0647–067; H01L 27/0711–0722; H01L 27/075–0783; H01L 27/082–0828; H01L 27/11801; H01L 27/11896; H01L 27/14681; H01L 29/66234–66348; H01L 29/73–749; H01L 21/76224–76237; H01L 21/823481; H01L 21/823878; H01L 21/1189; H01L 21/11892; H01L 2027/11829–11833;
(Continued)

(56) References Cited

U.S. PATENT DOCUMENTS

2009/0096033 A1\* 4/2009 Pendharkar ....... H01L 21/76232
257/E29.345

\* cited by examiner

*Primary Examiner* — Julio J Maldonado
*Assistant Examiner* — Stanetta D Isaac
(74) *Attorney, Agent, or Firm* — The Marbury Law Group, PLLC

(57) ABSTRACT

Devices and methods of manufacture for a deep trench layout area-saving semiconductor structure for use with bipolar-CMOS-DMOS (BCD) devices. A semiconductor device may comprise a first BCD device formed within a first perimeter of a first BCD layout area, and a deep trench isolation structure defining the first perimeter of the first BCD layout area, in which the deep trench isolation structure may comprise a first rounded corner that may define a first corner of the first BCD layout area. A semiconductor device may comprise, a substrate, BCD device formed on the substrate, and a deep trench isolation structure laterally surrounding the BCD device. The deep trench isolation structure, with respect to a top-down view, may comprise vertical portions, horizontal portions, a "T"-shaped intersection connecting at least one vertical portion and at least one horizontal portion, and a cross-shaped intersection connecting two vertical portions and two horizontal portions.

20 Claims, 36 Drawing Sheets

(58) Field of Classification Search
CPC ........... H01L 2027/1189–11892; H10B 12/10; H10B 20/10; H10B 10/10; H10B 69/00
See application file for complete search history.

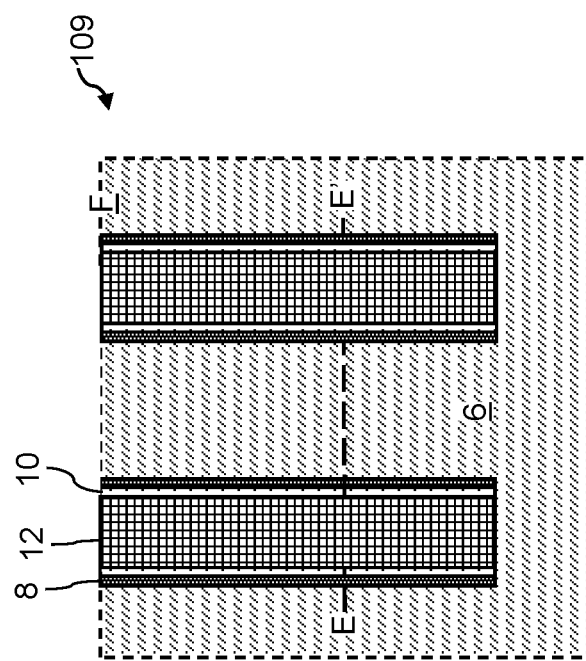
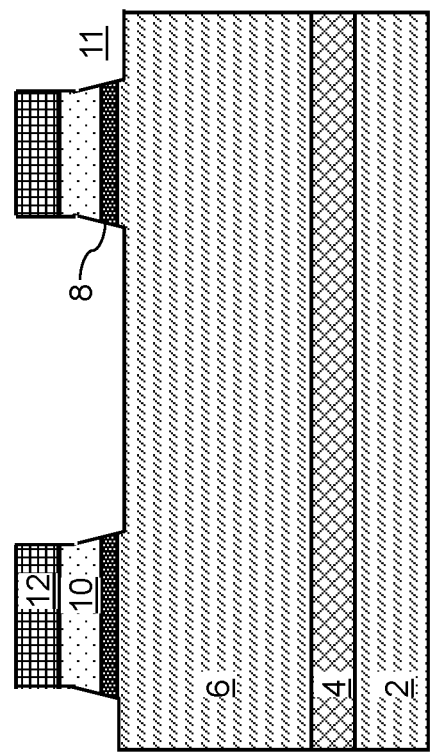
FIG. 2E
FIG. 2F

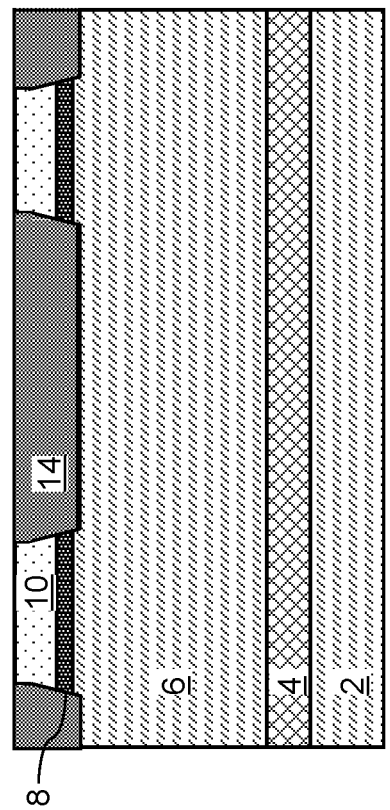
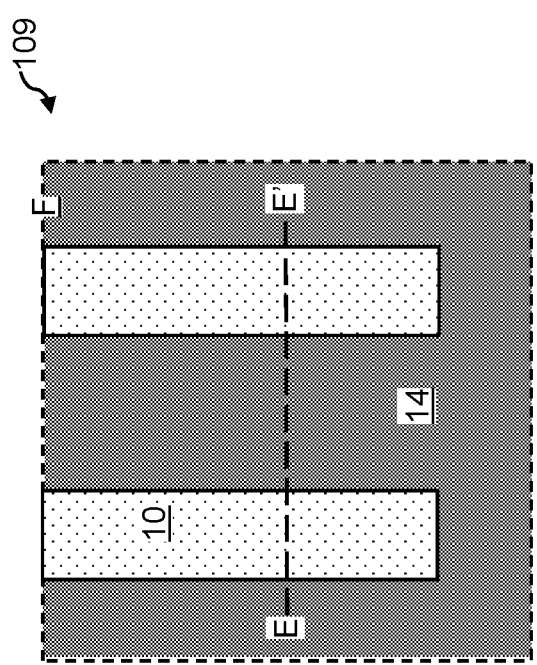
FIG. 3F
FIG. 3E

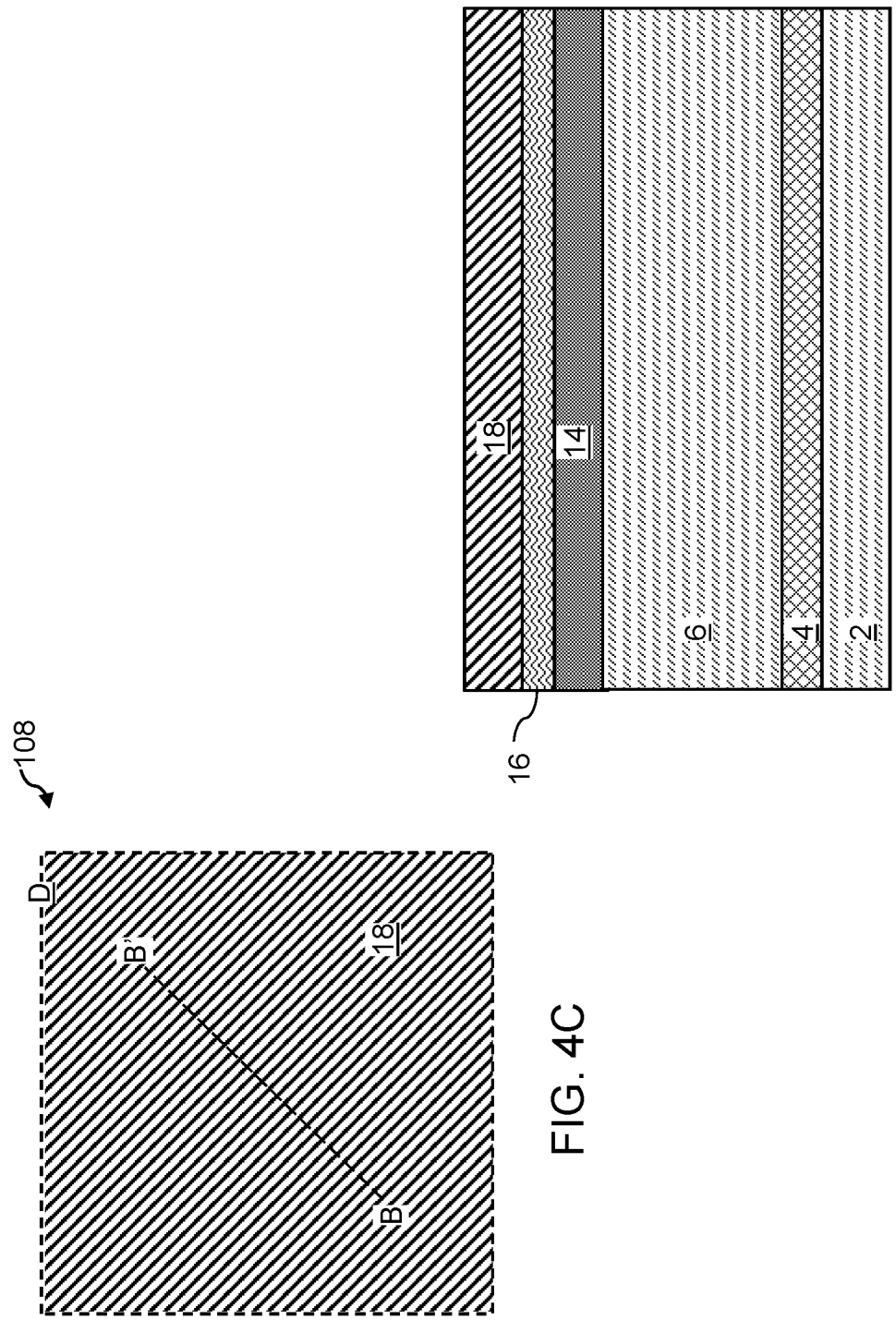

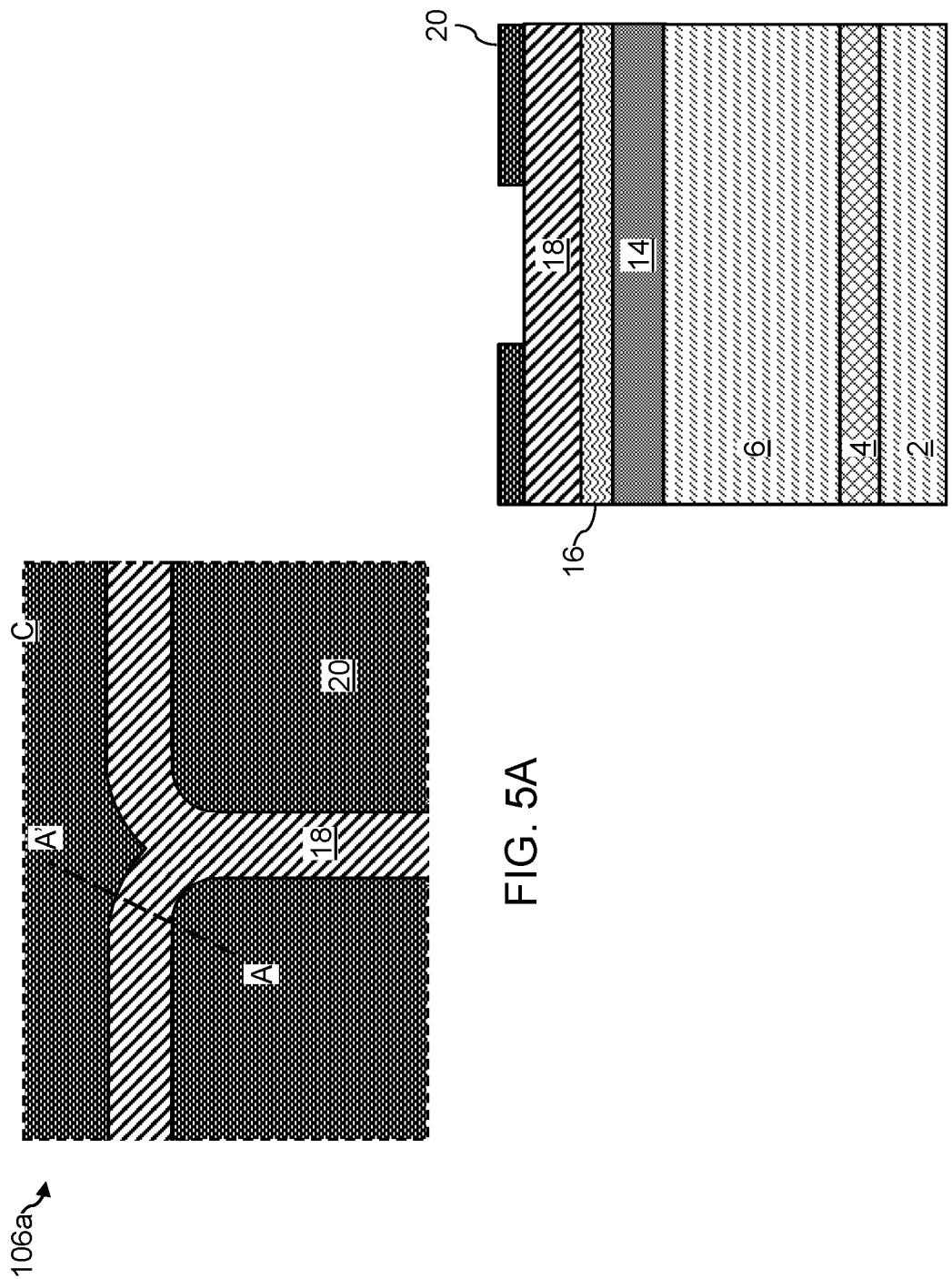

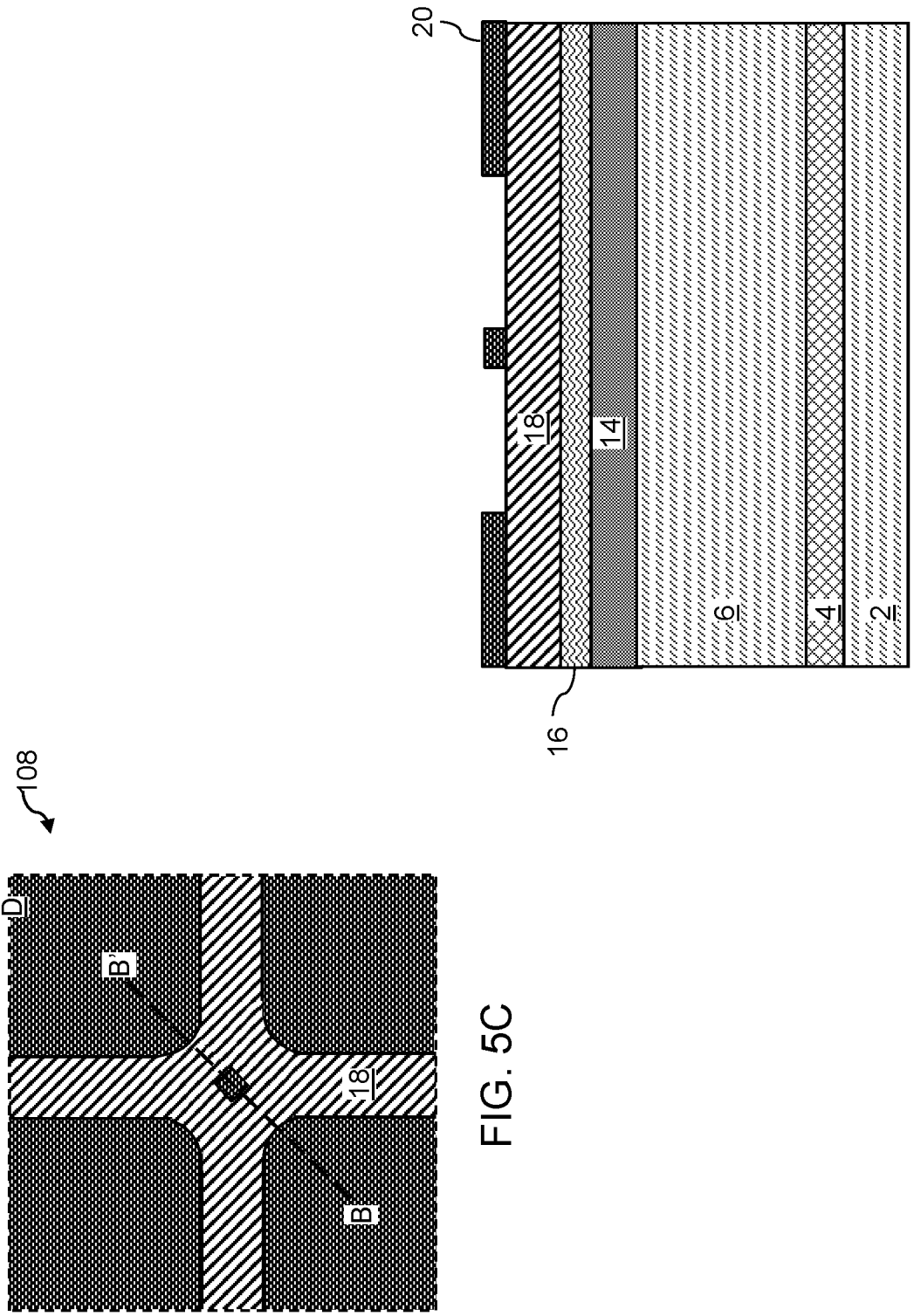

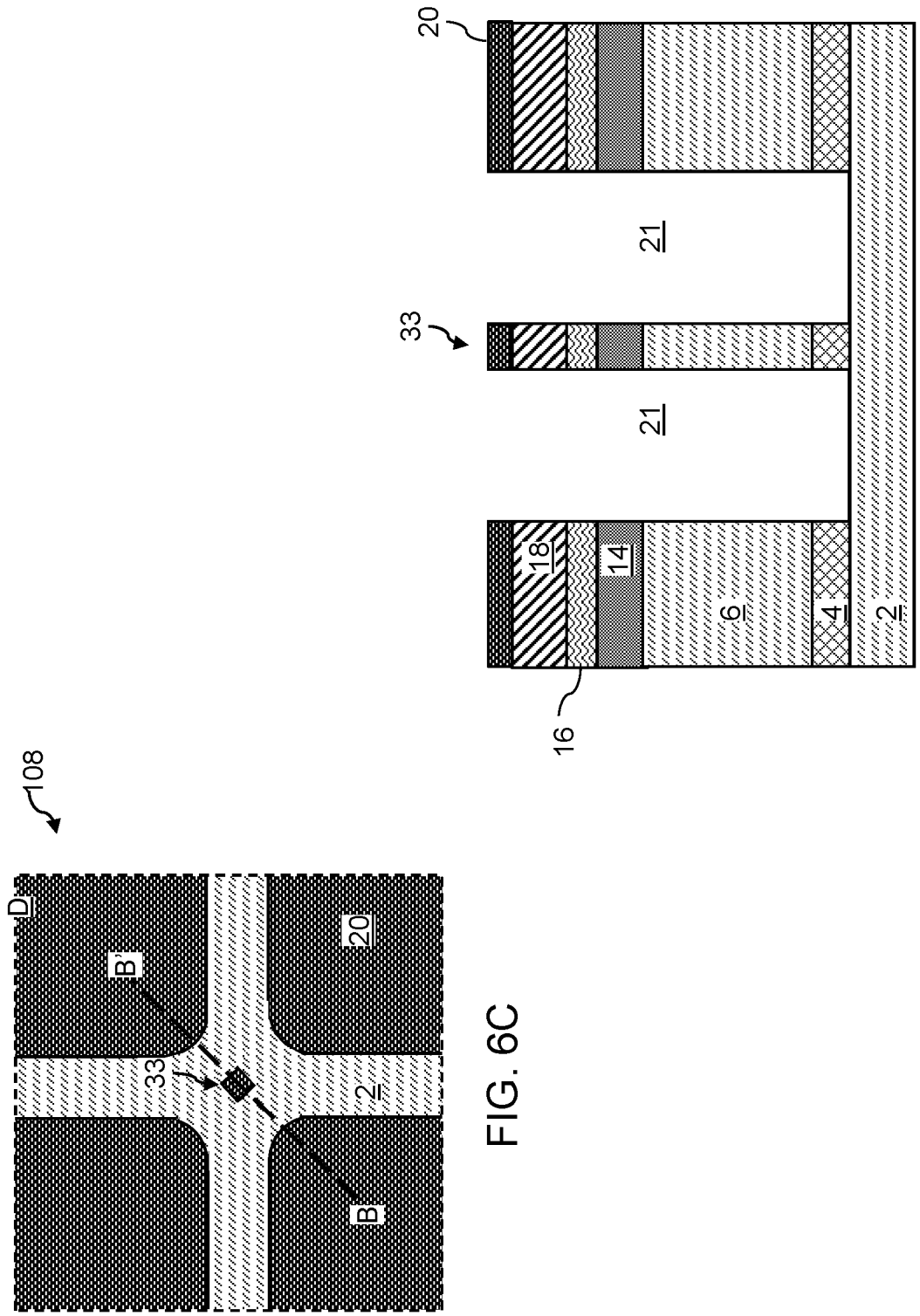

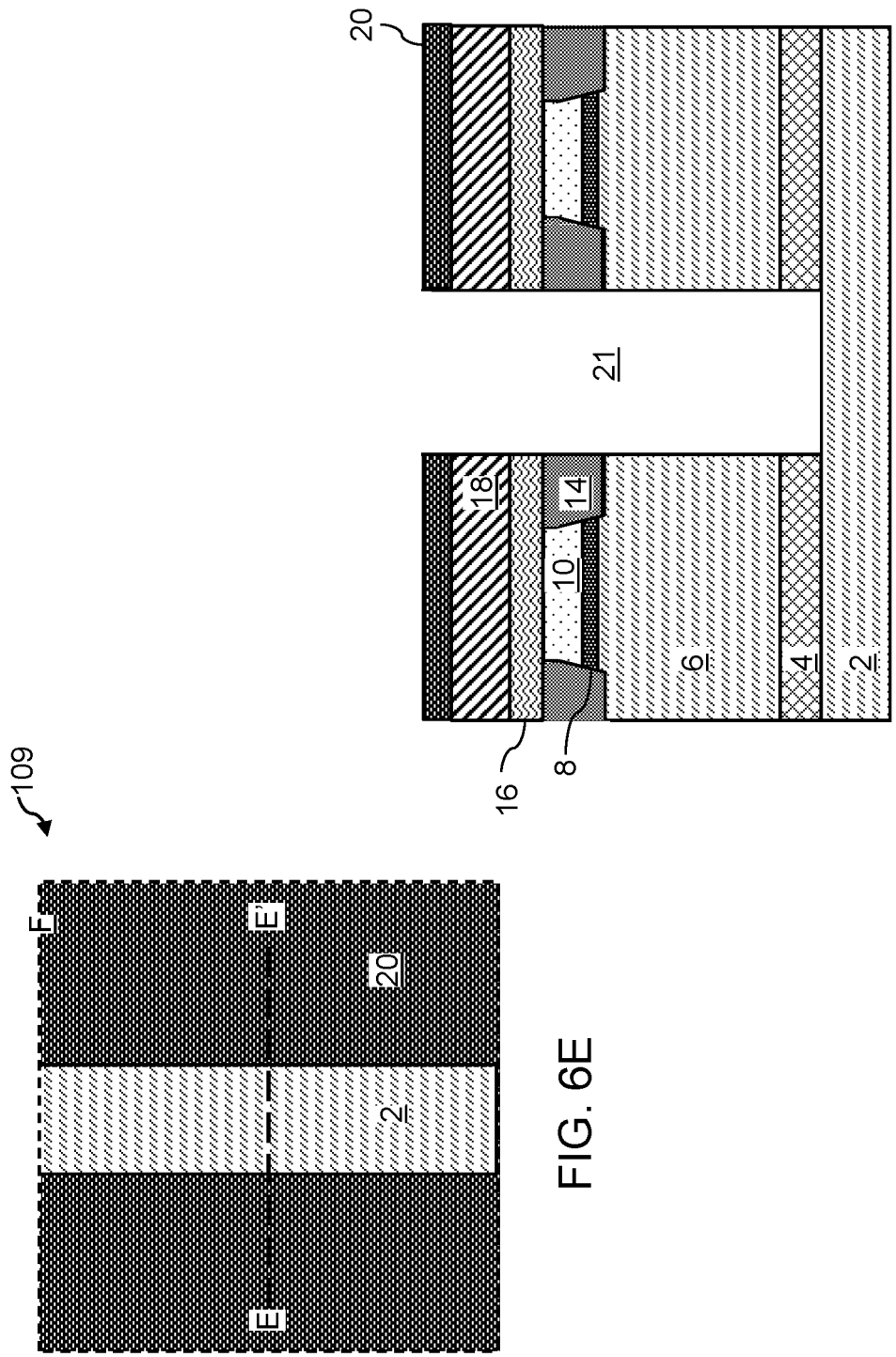

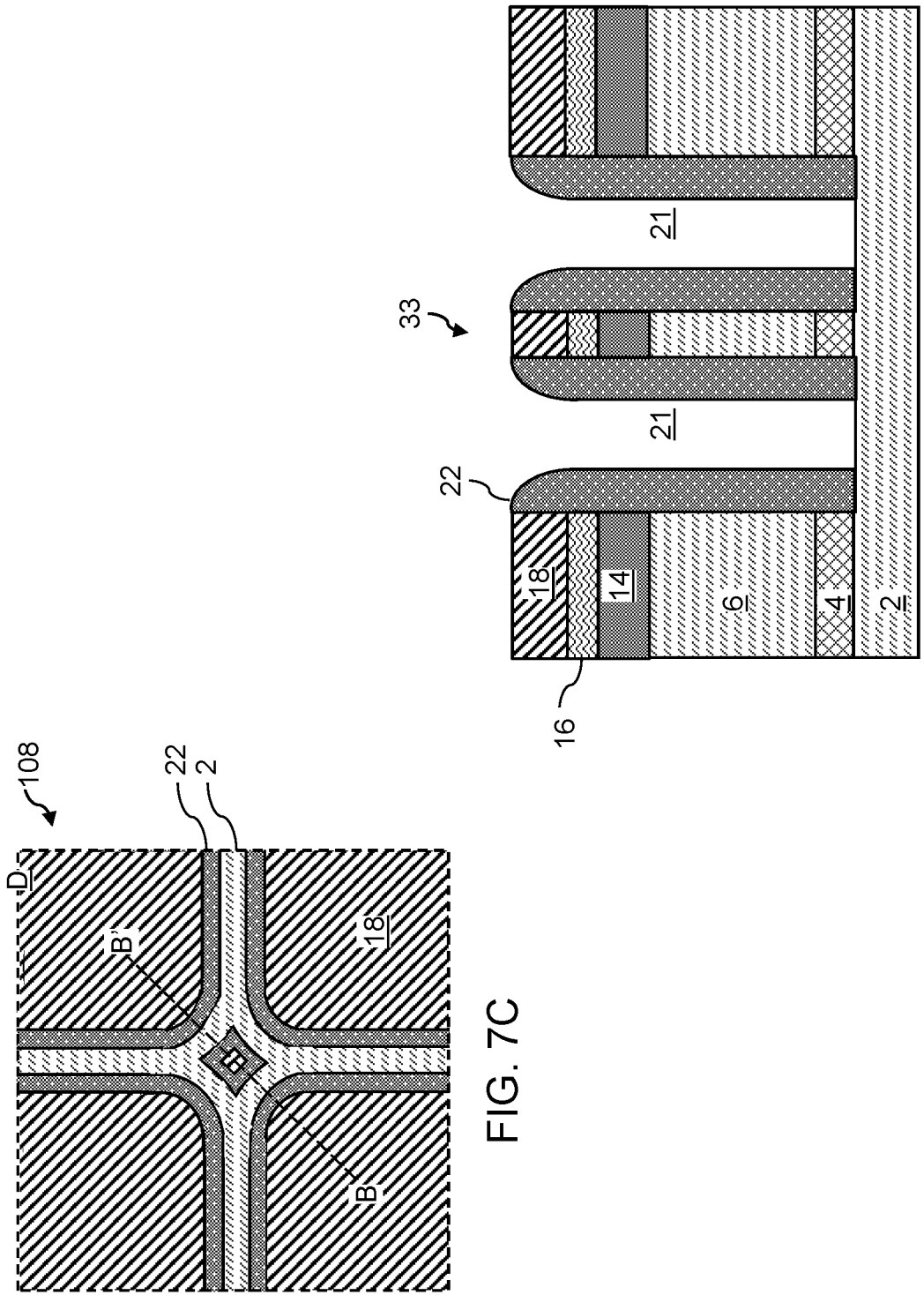

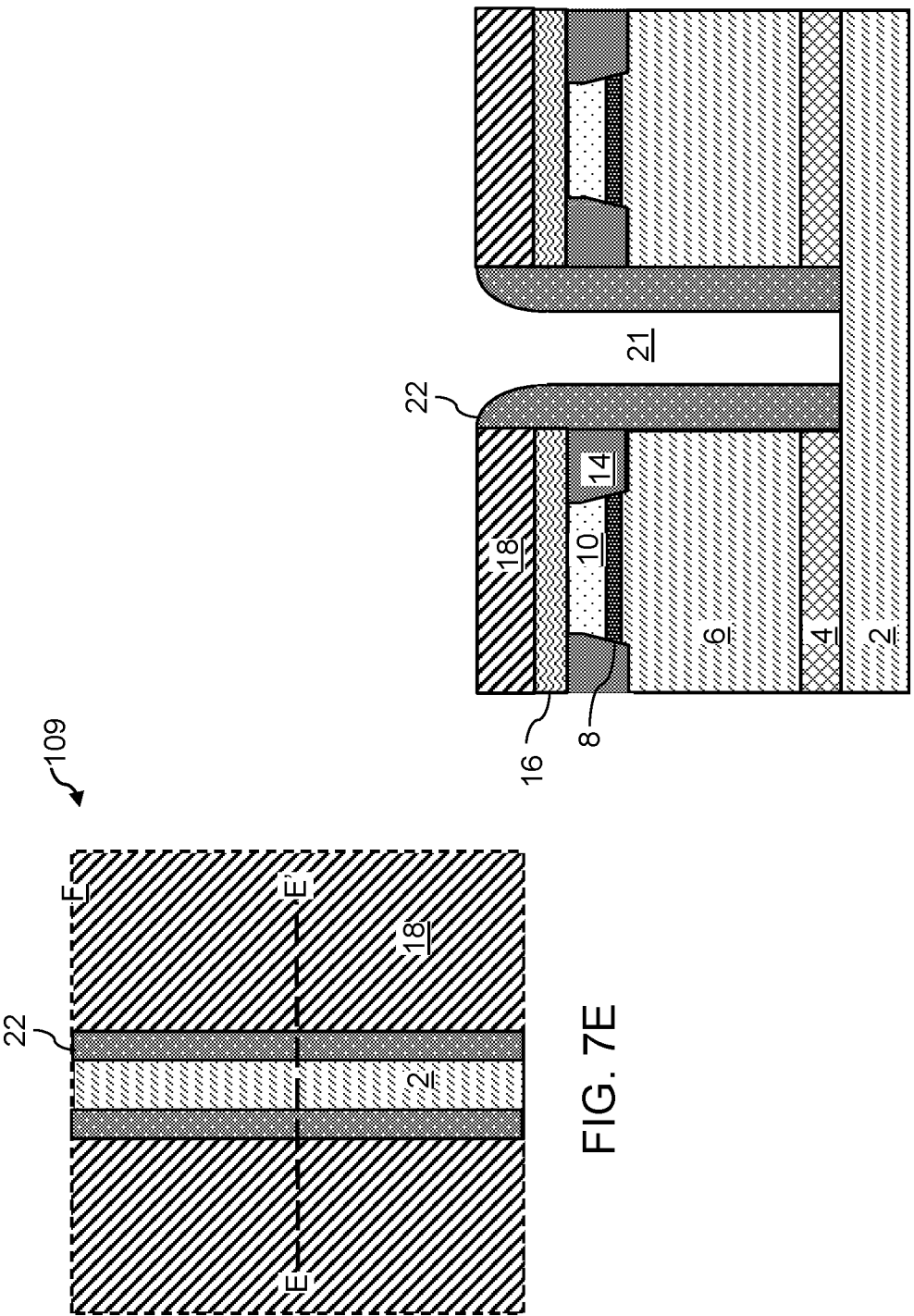

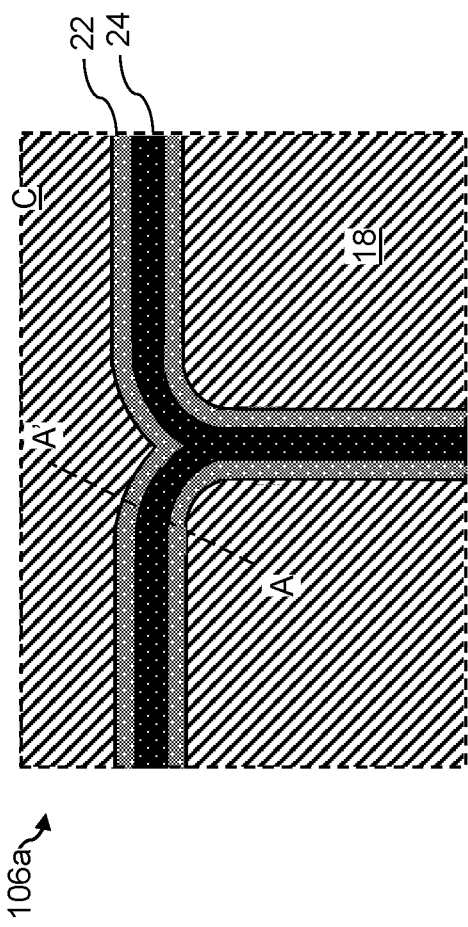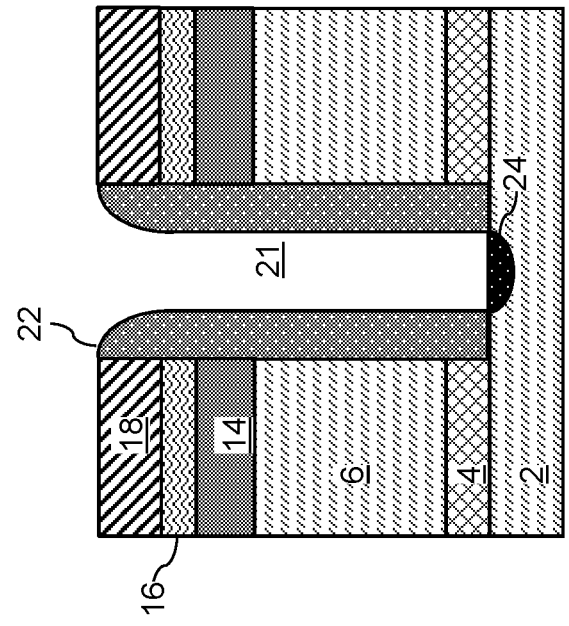
FIG. 8A
FIG. 8B

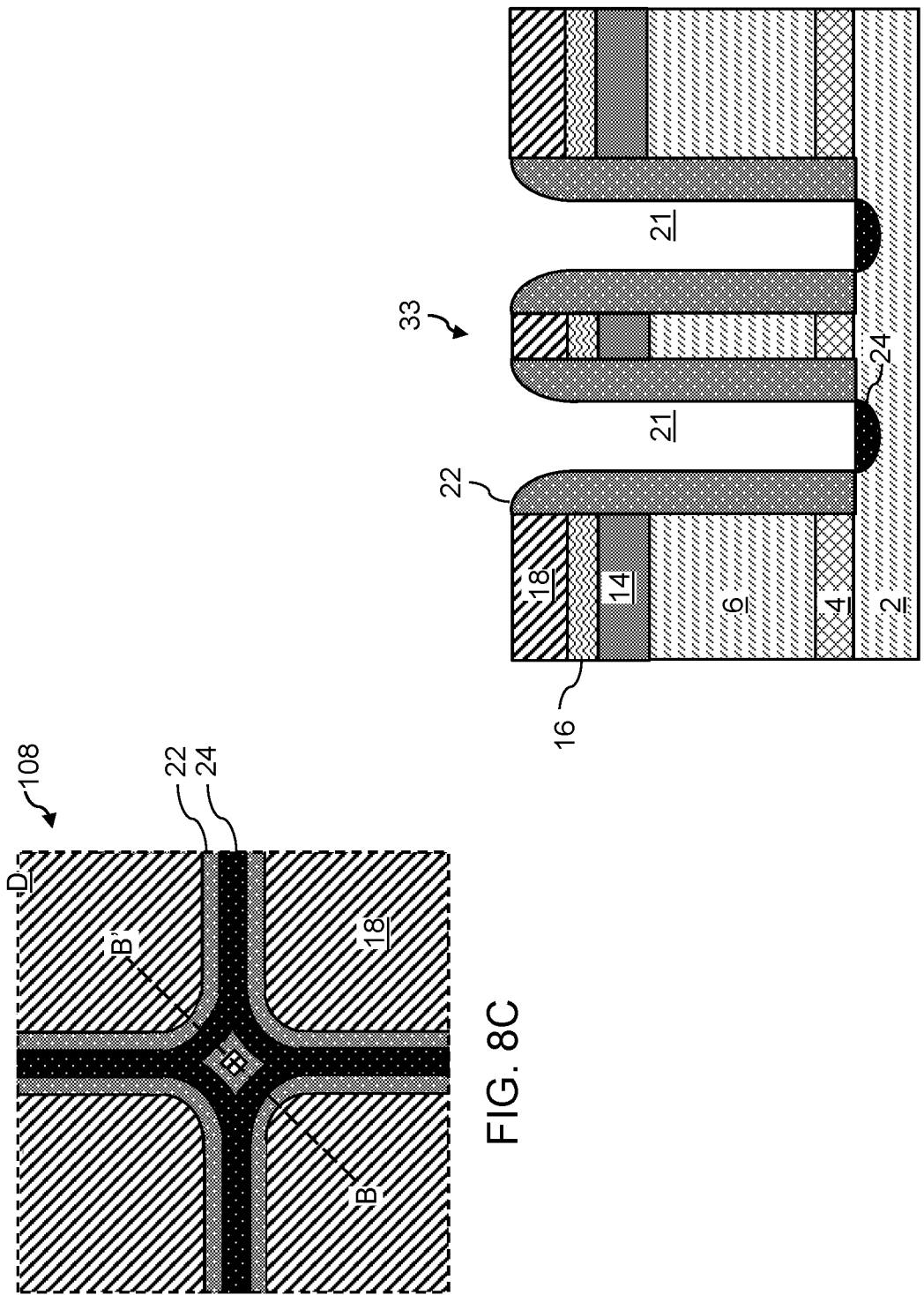

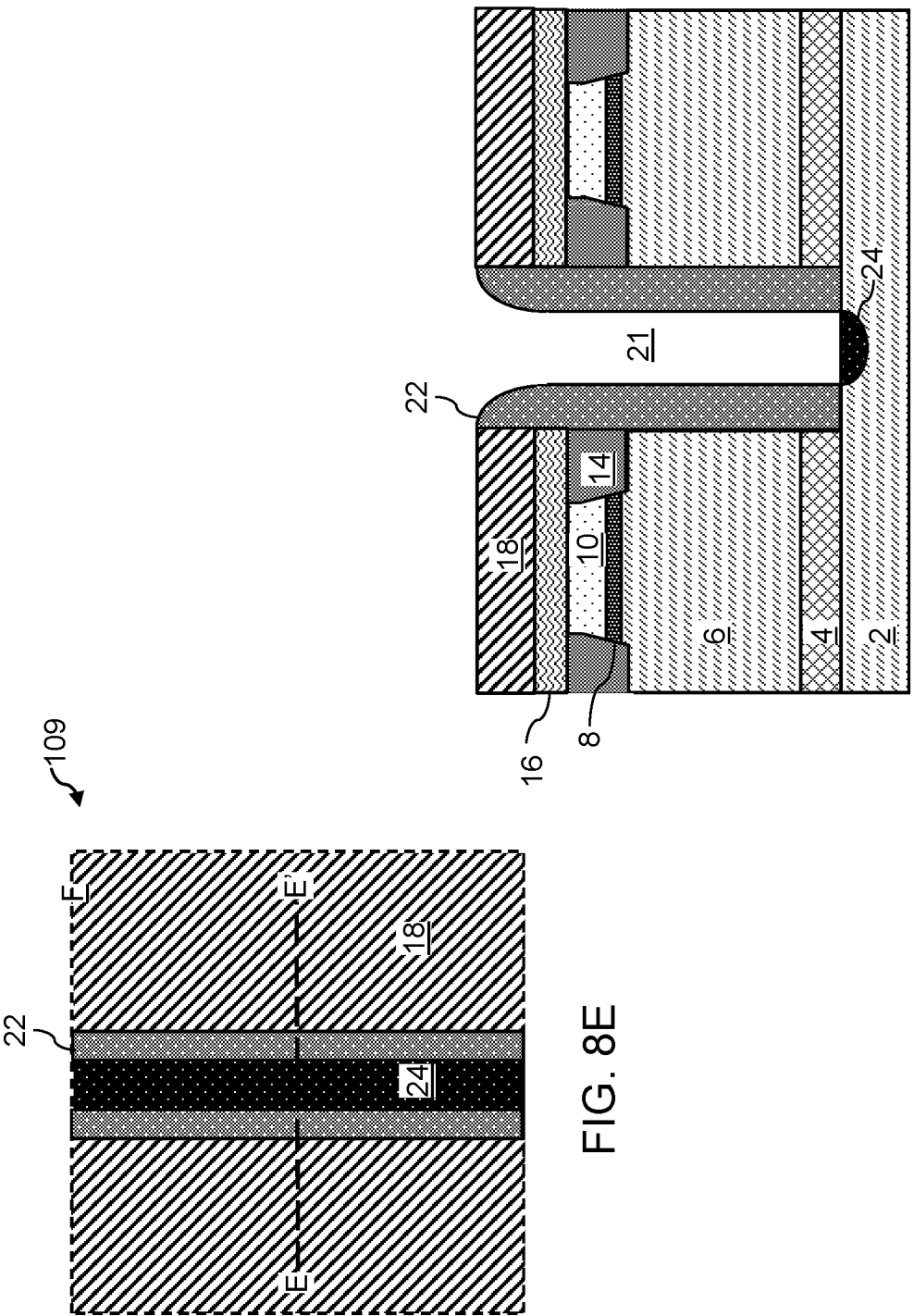

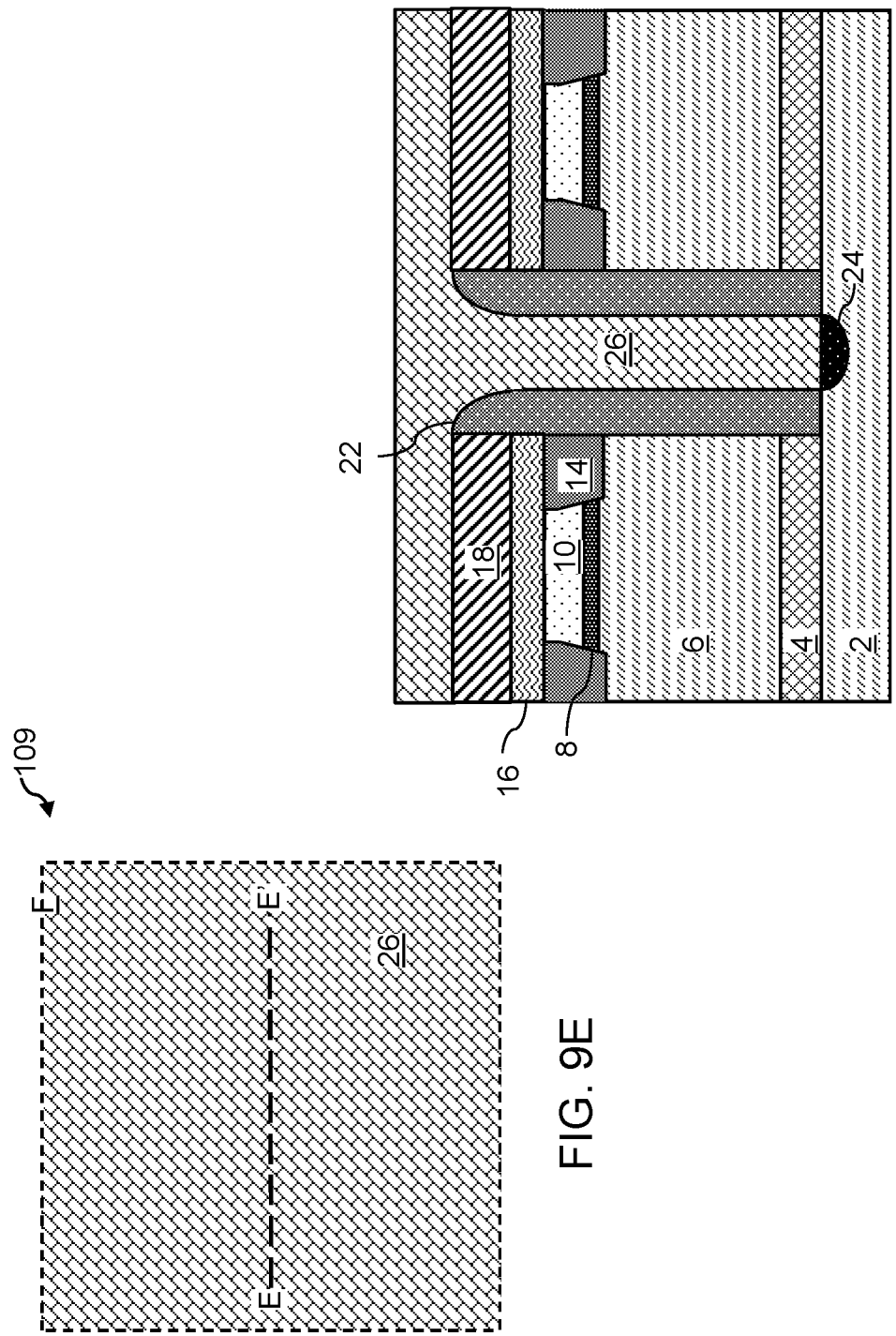

BCD DEVICE LAYOUT AREA DEFINED BY A DEEP TRENCH ISOLATION STRUCTURE AND METHODS FOR FORMING THE SAME

RELATED APPLICATIONS

This application claims the benefit of priority from U.S. Provisional Application No. 63/180,854, entitled "A Deep Trench layout area saving method for BCD Device," filed on Apr. 28, 2021, the entire contents of which are incorporated herein by reference for all purposes.

BACKGROUND

Bipolar/CMOS/DMOS (BCD) devices include a bipolar region to perform analog functions, a complementary metal oxide semiconductor (CMOS) region to perform digital functions, and a double diffused metal oxide semiconductor (DMOS) region which includes power and high-voltage elements to provide power. By integrating three distinct types of components on a single die, BCD technology may reduce the number of components in the bill of materials (BoM). Fewer chip components in the BoM further reduces the area on the board, thus driving down costs. However, integrating different types of components that operate at different voltages can present challenges in electrical isolation, including increased BCD layout area to provide for sufficient isolation. Such increased BCD layout area may unnecessarily use up valuable chip real estate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2E is a top-down, magnified view of a region F of FIG. 1 after formation of a shallow trench according to an embodiment of the present disclosure.

FIG. 2F is a vertical, cross-sectional, magnified view of a region of the exemplary structure along the vertical plane E-E' of FIG. 2E.

FIG. 3E is a top-down, magnified view of a region F of FIG. 1 after depositing a shallow trench isolation material layer according to an embodiment of the present disclosure.

FIG. 3F is a vertical, cross-sectional, magnified view of a region of the exemplary structure along the vertical plane E-E' of FIG. 3E.

FIG. 4C is a top-down, magnified view of a region D of FIG. 1 after depositing an oxide material layer according to an embodiment of the present disclosure.

FIG. 4D is a vertical, cross-sectional, magnified view of a region of the exemplary structure along the vertical plane B-B' of FIG. 4C.

FIG. 5A is a top-down, magnified view of a region C of FIG. 1 after etching a hard mask layer according to an embodiment of the present disclosure.

FIG. 5B is a vertical, cross-sectional, magnified view of a region of the exemplary structure along the vertical plane A-A' of FIG. 5A.

FIG. 5C is a top-down, magnified view of a region D of FIG. 1 after etching a hard mask layer according to an embodiment of the present disclosure.

FIG. 5D is a vertical, cross-sectional, magnified view of a region of the exemplary structure along the vertical plane B-B' of FIG. 5C.

FIG. 6C is a top-down, magnified view of a region D of FIG. 1 after etching a deep trench according to an embodiment of the present disclosure.

FIG. 6D is a vertical, cross-sectional, magnified view of a region of the exemplary structure along the vertical plane B-B' of FIG. 6C.

FIG. 6E is a top-down, magnified view of a region F of FIG. 1 after etching a deep trench according to an embodiment of the present disclosure.

FIG. 6F is a vertical, cross-sectional, magnified view of a region of the exemplary structure along the vertical plane E-E' of FIG. 6E.

FIG. 7C is a top-down, magnified view of a region D of FIG. 1 after forming deep trench isolation sidewalls according to an embodiment of the present disclosure.

FIG. 7D is a vertical, cross-sectional, magnified view of a region of the exemplary structure along the vertical plane B-B' of FIG. 7C.

FIG. 7E is a top-down, magnified view of a region F of FIG. 1 after forming deep trench isolation sidewalls according to an embodiment of the present disclosure.

FIG. 7F is a vertical, cross-sectional, magnified view of a region of the exemplary structure along the vertical plane E-E' of FIG. 7E.

FIG. 8A is a top-down, magnified view of a region C of FIG. 1 after performing ion implantation according to an embodiment of the present disclosure.

FIG. 8B is a vertical, cross-sectional, magnified view of a region of the exemplary structure along the vertical plane A-A' of FIG. 8A.

FIG. 8C is a top-down, magnified view of a region D of FIG. 1 after performing ion implantation according to an embodiment of the present disclosure.

FIG. 8D is a vertical, cross-sectional, magnified view of a region of the exemplary structure along the vertical plane B-B' of FIG. 8C.

FIG. 8E is a top-down, magnified view of a region F of FIG. 1 after performing ion implantation according to an embodiment of the present disclosure.

FIG. 8F is a vertical, cross-sectional, magnified view of a region of the exemplary structure along the vertical plane E-E' of FIG. 8E.

FIG. 9E is a top-down, magnified view of a region F of FIG. 1 after depositing a polysilicon layer according to an embodiment of the present disclosure.

FIG. 9F is a vertical, cross-sectional, magnified view of a region of the exemplary structure along the vertical plane E-E' of FIG. 9E.

DETAILED DESCRIPTION

Figure 1:
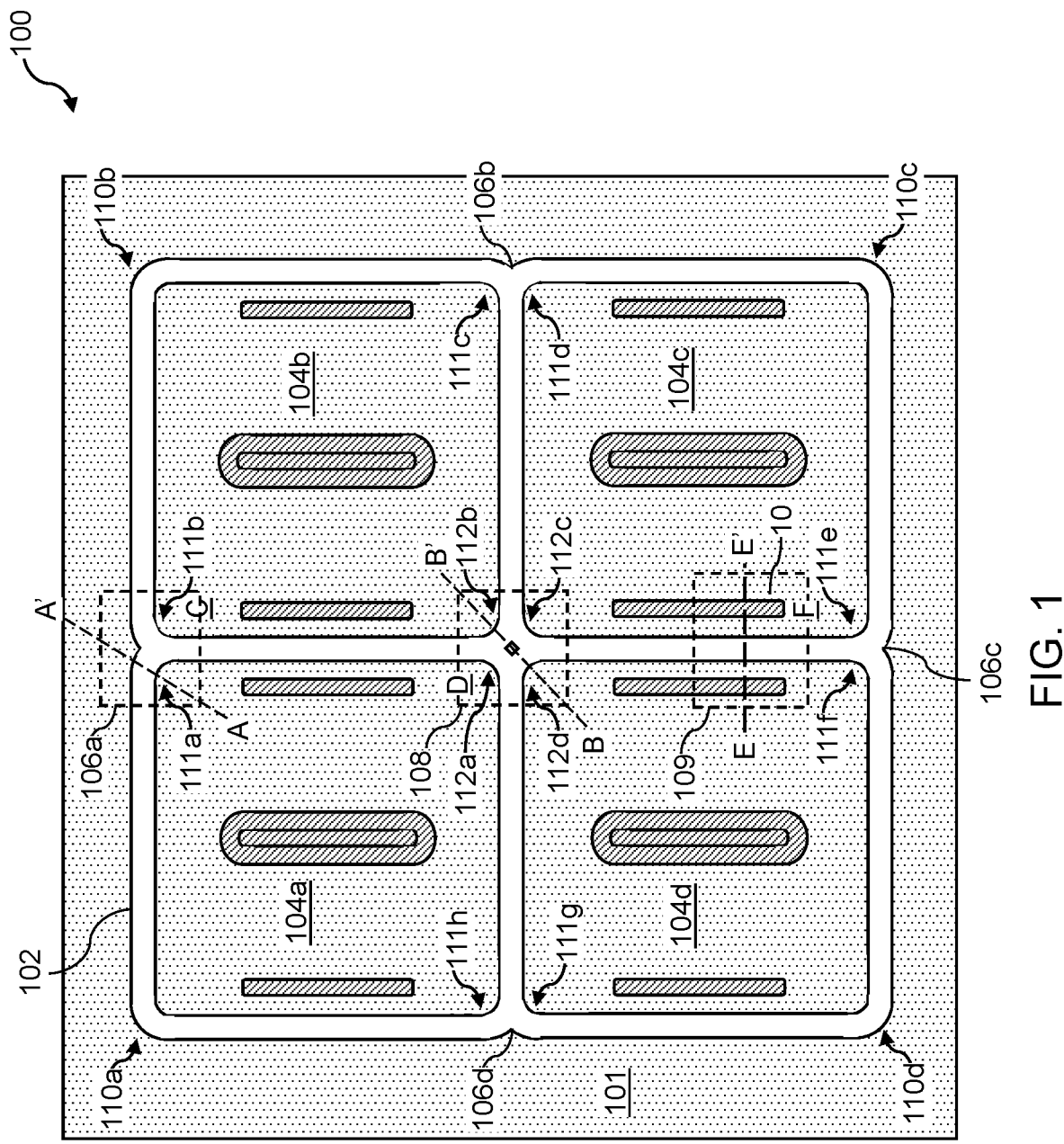
FIG. 1 is a top-down view of the exemplary structure after formation of a deep trench isolation structure in the substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise. Embodiments of the present disclosure are directed to a field effect transistor including a downward-protruding gate electrode and methods for forming the same, the various aspects of which are now described in detail.

Various embodiment structures and methods described herein may be used to provide electrical isolation while reducing isolation structure layout area surrounding bipolar/CMOS/DMOS (BCD) devices. The development of 10 nanometer transistors has led to the breakdown of Moore's law. In response, semiconductor chip designers are focusing their efforts on integrating different types of semiconductor devices on a single chip. For example, a single semiconductor chip, such as a BCD chip, may have an analog region comprising bipolar junction transistors, a digital logic region comprising complementary metal oxide semiconductor (CMOS) transistors and a power region comprising double diffused metal oxide semiconductor (DMOS) transistors. By combining the functionality that previously had been fabricated on separate chips into a single integrated chip, the number of chips may be reduced. Consequently, more real estate on circuit boards may available as fewer chips may be required. Thus, the cost of assembly may also be lowered.

However, the various semiconductor devices placed in close proximity to one another may utilize different voltages in operation. For example, in some embodiments, the DMOS transistors may have an operating voltage greater than 50 volts. In contrast, the bipolar or CMOS transistor devices may have an operating voltage less than 50 V, and/or less than 24 V, and/or less than 12 V, and/or less than 6 V. By placing the high voltage devices in close proximity to the low voltage devices, significant damage may occur to the low voltage devices. Thus, structures to isolate the high voltage devices from the low voltage devices may be employed to protect the low voltage devices. However, these isolation structures may require a significant amount of space within a chip design layout. For example, deep trench isolation structures for a 110V BCD device on a semiconductor-on-insulator (SOI) substrate may include design rule restrictions such as requiring greater than 2 micrometers between each deep trench isolation structure and having a deep trench width of greater than or equal to 2 micrometers to provide sufficient electrical isolation between BCD layout areas. Reducing the area designated for these deep trench isolation structures may reduce the overall design footprint of a BCD device, allowing for more BCD devices, or other logic devices, to be formed within a given chip layout.

According to an aspect of the present disclosure, the embodiment structures and methods disclosed herein may be used to reduce deep trench isolation structure size while maintaining sufficient electrical isolation between BCD layout areas. The various embodiment structures and methods disclosed herein may provide for a single, continuous deep trench isolation structure that surrounds one or more BCD layout areas. The BCD layout areas within a chip design may be electrically separated by a single deep trench isolation structure. Thus, with BCD layout areas sharing a same single deep trench isolation structure, the total chip design layout area required for providing sufficient electrical isolation between BCD layout areas may be reduced. As a result, additional space that may be used for implementing additional logic devices may be made available.

Additionally, according to an aspect of the present disclosure, the deep trench isolation structure may have rounded portions, including rounded, or curved, corners, rounded "T"-shaped intersections, and rounded cross-shape intersections of the deep trench isolation structure. By implementing rounded or curved portions of the deep trench isolation structure, sidewall oxide thickness asymmetry may be reduced. Increasing symmetry between sidewall oxide thicknesses within the deep trench isolation structure may reduce the isolation risk (i.e., a breakdown voltage being exceeded) for BCD devices, including 110V BCD devices. Furthermore, the rounded or curved portions of a cross-type intersection may eliminate a poly-filling gap between sidewall oxides, thereby further reducing the overall layout of the single, continuous deep trench isolation structure.

FIG. 1 is a top-down view of the exemplary structure after formation of a deep trench isolation structure 102 in a substrate 101 according to an embodiment of the present disclosure. A semiconductor structure 100 may include one or more BCD devices formed in the substrate 101. A deep trench isolation structure 102 may physically separate and electrically isolate various bipolar, CMOS, and/or DMOS devices formed within various BCD layout areas (e.g., 104a, 104b, 104c, 104d). For example, the deep trench isolation structure 102 may be used to physically separate and electrically isolate a first BCD layout area 104a, a second BCD layout area 104b, a third BCD layout area 104c, and a fourth BCD layout area 104d and the devices formed therein. A first BCD device may be formed within a first perimeter of the first BCD layout area 104a, a second BCD device may be formed within a second perimeter of the second BCD layout area 104b, a third BCD device may be formed within a third perimeter of the third BCD layout area 104c, and a fourth BCD device may be formed within a fourth perimeter of the fourth BCD layout area 104d. The deep trench isolation structure may define the perimeter of the BCD layout areas 104a, 104b, 104c, 104d. The deep trench isolation structure 102 may be a single, continuous isolation structure laterally surrounding and separating each individual BCD layout area (e.g., BCD layout areas 104a, 104b, 104c, 104d). For example, the deep trench isolation structure 102 may surround each of the BCD layout areas 104a, 104b, 104c, 104d and may be positioned between each of the BCD layout areas 104a, 104b, 104c, 104d.

The deep trench isolation structure 102 may include rounded corners (e.g., rounded corners 110a, 110b, 110c, 110d), "T"-shaped intersections (e.g., 106a, 106b, 106c, 106d), and cross-shaped intersections (e.g., 108) that may be formed within the substrate 101. The deep trench isolation structure 102 may have, with respect to a top-down view, vertical portions (e.g., vertical portion 109) and horizontal portions that connect to, or are otherwise formed to couple at, rounded corners, "T"-shaped intersections, and cross-shaped intersections. The deep trench isolation structure 102 may include at least one "T"-shaped intersection connecting at least one vertical portion and at least one horizontal portion. For example, the deep trench isolation structure 102 may include "T"-shaped intersections 106a, 106b, 106c, 106d coupling portions of the deep trench isolation structure 102 located around the first BCD layout area 104a, the second BCD layout area 104b, the third BCD layout area 104c, and the fourth BCD layout area 104d.

The deep trench isolation structure 102 may include at least one cross-shaped intersection connecting two vertical portions and two horizontal portions. For example, the deep trench isolation structure 102 may include a cross-shaped intersection 108. The cross-shaped intersection 108 may couple or otherwise connect portions of the deep trench isolation structure 102 positioned between the first BCD layout area 104a and the second BCD layout area 104b, between the second BCD layout area 104b and the third BCD layout area 104c, between the third BCD layout area 104c and the fourth BCD layout area 104d, and between the fourth BCD layout area 104d and the first BCD layout area 104a.

The cross-shaped intersection 108 may have laterally-extending vertical and horizontal portions connected to "T"-shaped intersections 106a, 106b, 106c, 106d. The "T"-shaped intersections 106a, 106b, 106c, 106d may have laterally-extending vertical and horizontal portions connected to rounded corners 110a, 110b, 110c, 110d. The rounded corners 110a, 110b, 110c, 110d, the "T"-shaped intersections 106a, 106b, 106c, 106d, the cross-shaped intersection 108, and vertical and horizontal portions may be formed to create the single, continuous deep trench isolation structure 102. For example, the vertical portions, the horizontal portions, the "T"-shaped intersections (e.g., 106a, 106b, 106c, 106d), and the cross-shaped intersection 108 that form the deep trench isolation structure 102 may physically separate or electrically isolate the devices formed in the first BCD layout area 104a, the second BCD layout area 104b, the third BCD layout area 104c, and the fourth BCD layout area 104d from one another.

The deep trench isolation structure 102 may surround the first BCD layout area 104a, such that the deep trench isolation structure 102 may define a perimeter of the first BCD layout area 104a. The first BCD layout area 104a may have rounded corners, in which a shape of the first BCD layout area 104a may be defined by an inner sidewall of the deep trench isolation structure 102. An outer sidewall of the deep trench isolation structure 102 may be equidistant (e.g., 2 micrometers) from the inner sidewall around the first BCD layout area 104a. At the rounded corners (e.g., first rounded corner 110a, first "T"-shaped intersection rounded corner 111a, "T"-shaped intersection rounded corner 111h, first cross-shaped intersection rounded corner 112a), the outer sidewall may have a same radius of curvature as the inner sidewall. The shape and dimensions of the rounded corners of the first BCD layout area 104a may be defined by the first rounded corner 110a, the "T"-shaped intersections 106a, 106d, and the cross-shaped intersection 108 of the deep trench isolation structure 102.

The deep trench isolation structure 102 may surround the second BCD layout area 104b, such that the deep trench isolation structure 102 may define a perimeter of the second BCD layout area 104b. The second BCD layout area 104b may have rounded corners, in which a shape of the second BCD layout area 104b may be defined by an inner sidewall of the deep trench isolation structure 102. An outer sidewall of the deep trench isolation structure 102 may be equidistant (e.g., 2 micrometers) from the inner sidewall around the second BCD layout area 104b. At the rounded corners (e.g., rounded corner 110b, second "T"-shaped intersection rounded corner 111b, "T"-shaped intersection rounded corner 111c, second cross-shaped intersection rounded corner 112b), the outer sidewall may have a same radius of curvature as the inner sidewall. The shape and dimensions of the rounded corners of the second BCD layout area 104b may be defined by the rounded corner 110b, the "T"-shaped intersections 106a, 106b, and the cross-shaped intersection 108 of the deep trench isolation structure 102.

The deep trench isolation structure 102 may surround the third BCD layout area 104c, such that the deep trench isolation structure 102 may define a perimeter of the third BCD layout area 104c. The third BCD layout area 104c may have rounded corners, in which a shape of the third BCD layout area 104c may be defined by an inner sidewall of the deep trench isolation structure 102. An outer sidewall of the deep trench isolation structure 102 may be equidistant (e.g., 2 micrometers) from the inner sidewall around the third BCD layout area 104c. At the rounded corners (e.g., rounded corner 110c, "T"-shaped intersection rounded corners 111d, 111e, third cross-shaped intersection rounded corner 112c), the outer sidewall may have a same radius of curvature as the inner sidewall. The shape and dimensions of the rounded corners of the third BCD layout area 104c may be defined by the rounded corner 110c, the "T"-shaped intersections 106b, 106c, and the cross-shaped intersection 108 of the deep trench isolation structure 102.

The deep trench isolation structure 102 may surround the fourth BCD layout area 104d, such that the deep trench isolation structure 102 may define a perimeter of the fourth BCD layout area 104d. The fourth BCD layout area 104d may have rounded corners, in which a shape of the fourth BCD layout area 104d may be defined by an inner sidewall of the deep trench isolation structure 102. An outer sidewall of the deep trench isolation structure 102 may be equidistant (e.g., 2 micrometers) from the inner sidewall around the fourth BCD layout area 104d. At the rounded corners (e.g., rounded corner 110d, "T"-shaped intersection rounded corners 111f, 111g, fourth cross-shaped intersection rounded corner 112d), the outer sidewall may have a same radius of curvature as the inner sidewall. The shape and dimensions of the rounded corners of the fourth BCD layout area 104d may be defined by the rounded corner 110d, the "T"-shaped intersections 106c, 106d, and the cross-shaped intersection 108 of the deep trench isolation structure 102.

The "T"-shaped intersection 106a may connect, or otherwise be formed to couple, portions of the deep trench isolation structure 102 adjacent to proximate rounded corners (e.g., first "T"-shaped intersection rounded corner 111a, second "T"-shaped intersection rounded corner 111b) of the first BCD layout area 104a and the second BCD layout area 104b. The "T"-shaped intersection 106a may include inner sidewalls that define a shape of the first BCD layout area 104a and a shape of the second BCD layout area 104b including the proximate rounded corners (e.g., "T"-shaped intersection rounded corners 111a, 111b). The "T"-shaped intersection 106a may further include an outer sidewall that is equidistant from the inner sidewalls around the first BCD layout area 104a and the second BCD layout area 104b, in which the outer sidewall has a same radius of curvature as the inner sidewalls with respect to each rounded corner of the proximate rounded corners (e.g., "T"-shaped intersection rounded corners 111a, 111b).

The "T"-shaped intersection 106b may connect, or otherwise be formed to couple, portions of the deep trench isolation structure 102 adjacent to proximate rounded corners (e.g., "T"-shaped intersection rounded corners 111c, 111d) of the second BCD layout area 104b and the third BCD layout area 104c. The "T"-shaped intersection 106b may include inner sidewalls that define a shape of the second BCD layout area 104b and a shape of the third BCD layout area 104c including the proximate rounded corners (e.g., "T"-shaped intersection rounded corners 111c, 111d). The "T"-shaped intersection 106b may further include an outer sidewall that is equidistant from the inner sidewalls around the second BCD layout area 104b and the third BCD layout area 104c, in which the outer sidewall has a same radius of curvature as the inner sidewalls with respect to each rounded corner of the proximate rounded corners (e.g., "T"-shaped intersection rounded corners 111c, 111d).

The "T"-shaped intersection 106c may connect, or otherwise be formed to couple, portions of the deep trench isolation structure 102 adjacent to proximate rounded corners (e.g., "T"-shaped intersection rounded corners 111e, 111f) of the third BCD layout area 104c and the fourth BCD layout area 104d. The "T"-shaped intersection 106c may include inner sidewalls that define a shape of the third BCD layout area 104c and a shape of the fourth BCD layout area 104d including the proximate rounded corners (e.g., "T"-shaped intersection rounded corners 111e, 111f). The "T"-shaped intersection 106c may further include an outer sidewall that is equidistant from the inner sidewalls around the third BCD layout area 104c and the fourth BCD layout area 104d, in which the outer sidewall has a same radius of curvature as the inner sidewalls with respect to each rounded corner of the proximate rounded corners (e.g., "T"-shaped intersection rounded corners 111e, 111f).

The "T"-shaped intersection 106d may connect, or otherwise be formed to couple, portions of the deep trench isolation structure 102 adjacent to proximate rounded corners (e.g., "T"-shaped intersection rounded corners 111g, 111h) of the fourth BCD layout area 104d and the first BCD layout area 104a. The "T"-shaped intersection 106d may include inner sidewalls that define a shape of the fourth BCD layout area 104d and a shape of the first BCD layout area 104a including the proximate rounded corners (e.g., "T"-shaped intersection rounded corners 111g, 111h). The "T"-shaped intersection 106d may further include an outer sidewall that is equidistant from the inner sidewalls around the fourth BCD layout area 104d and the first BCD layout area 104a, in which the outer sidewall has a same radius of curvature as the inner sidewalls with respect to each rounded corner of the proximate rounded corners (e.g., "T"-shaped intersection rounded corners 111g, 111h).

The cross-shaped intersection 108 may connect, or otherwise be formed to couple, vertical and horizontal portions of the deep trench isolation structure 102 that are adjacent to proximate rounded corners of the first BCD layout area 104a, the second BCD layout area 104b, the third BCD layout area 104c, and the fourth BCD layout area 104 (e.g., cross-shaped intersection rounded corners 112a, 112b, 112c, 112d respectively). The cross-shaped intersection 108 may include inner sidewalls that may define shapes and dimensions of the first BCD layout area 104a, the second BCD layout area 104b, the third BCD layout area 104c, and the fourth BCD layout area 104d including the proximate rounded corners. The cross-shaped intersection 108 may further include a central node including an outer sidewall that may be equidistant from the inner sidewalls around the first BCD layout area 104a, the second BCD layout area 104b, the third BCD layout area 104c, and the fourth BCD layout area 104d. The outer sidewall may have a same radius of curvature as the inner sidewalls with respect to each rounded corner of the proximate rounded corners (e.g., cross-shaped intersection rounded corners 112a, 112b, 112c, 112d respectively). In some embodiments, a distance between the outer sidewall of the central node and the proximate inner sidewalls may be less than 2 micrometers.

In some embodiments, the rounded corners 110a, 110b, 110c, 110d, "T"-shaped intersection rounded corners 111a-111g, and cross-shaped intersection rounded corners 112a, 112b, 112c, 112d may have equivalent radius of curvature values. For example, the first rounded corner 110a may have a radius of curvature value that is equal to the radius of curvature value of the "T"-shaped intersection rounded corner 111a and the radius of curvature value of the first cross-shaped intersection rounded corner 112a. As another example, the rounded corner 110b may have a radius of curvature value that is equal to the radius of curvature value of the "T"-shaped intersection rounded corner 111e and the radius of curvature value of the fourth cross-shaped intersection rounded corner 112d. In some embodiments, the rounded corners 110a, 110b, 110c, 110d, "T"-shaped intersection rounded corners 111a-111g, and cross-shaped intersection rounded corners 112a, 112b, 112c, 112d may have different radius of curvature values. For example, the first rounded corner 110a may have a radius of curvature value that is different from the radius of curvature value of the "T"-shaped intersection rounded corner 111a and the radius of curvature value of the first cross-shaped intersection rounded corner 112a. As another example, the rounded corner 110c may have a radius of curvature value that is equal to the radius of curvature value of the "T"-shaped intersection rounded corner 111a and the radius of curvature value of the third cross-shaped intersection rounded corner 112c. As a further example, the rounded corners 110a, 110b, 110c, 110d may have a first radius of curvature value, the "T"-shaped intersection rounded corners 111a-111g may have a second radius of curvature value, and the cross-shaped intersection rounded corners 112a, 112b, 112c, 112d may have a third radius of curvature value. The first radius of curvature value may be different from the second radius of curvature value, and the third radius of curvature value may be different from the first radius of curvature value and the second radius of curvature value.

By implementing a single, continuous deep trench isolation structure 102 that may be shared and utilized by all BCD layout areas to electrically isolate each BCD layout area (e.g., BCD layout areas 104a, 104b, 104c, 104d), the total chip design footprint may be reduced. Reducing the chip design footprint by minimizing the size and dimensions of the deep trench isolation structure 102 may allow for more compact semiconductor designs, freeing up more space for implementing additional logic devices, including more BCD devices.

By implementing rounded or curved portions of the deep trench isolation structure (e.g., rounded corners 110a, 110b, 110c, 110d, "T"-shaped intersections 106a, 106b, 106c, 106d, cross-shaped intersection 108), sidewall oxide thickness asymmetry may be reduced. Increasing symmetry between sidewall oxide thicknesses within the deep trench isolation structure may reduce the isolation risk (i.e., a breakdown voltage being exceeded) for BCD devices, including 110V BCD devices. Furthermore, the rounded or curved portions of the cross-shaped intersection 108 may prevent the creation of a poly-filling gap between sidewall oxides, therefore further reducing the overall layout of the single, continuous deep trench isolation structure 102.

For ease of illustration, a 2×2 array of BCD layout areas is shown in FIG. 1. However, any number of BCD layout areas may be implemented with a single, continuous deep trench isolation structure 102. For example, an array of 10×8 BCD layout areas may be implemented and a deep trench isolation structure may surround and physically and electrically isolate each BCD layout area of the 10×8 array. BCD layout areas in such an array that are surrounded by four adjacent BCD layout areas may implement four cross-shaped intersections at each of the corners of said BCD layout area. Rounded corners and "T"-shaped intersection may be implemented at the outermost, external, BCD layout areas. As another example, an array of 1×5 BCD layout areas may be implemented and a deep trench isolation structure may surround and physically and electrically isolate each BCD layout area of the 1×5 array. BCD layout areas in such an array that have one or two adjacent BCD layout areas may implement "T"-shaped intersections and rounded corners to form the deep trench isolation structure. As a further example, a single BCD layout area may be surrounded by a deep trench isolation structure implementing only rounded corners. Still further, in other embodiments, 3×3, 4×4, 5×5, etc. array of BCD layout areas may be implemented.

The deep trench isolation structure 102 may be formed according to the following process flow as described with reference to FIGS. 2A-13.

Figure 2A:
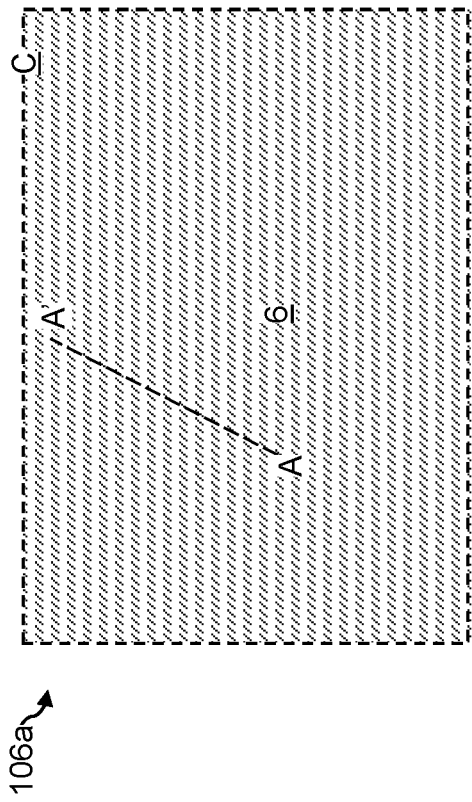
FIG. 2A is a top-down, magnified view of a region C of FIG. 1 after formation of a shallow trench according to an embodiment of the present disclosure.
Figure 2B:
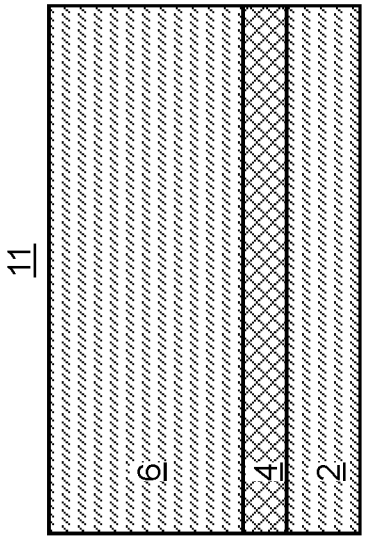
FIG. 2B is a vertical, cross-sectional, magnified view of a region of the exemplary structure along the vertical plane A-A' of FIG. 2A.
Figure 2D:
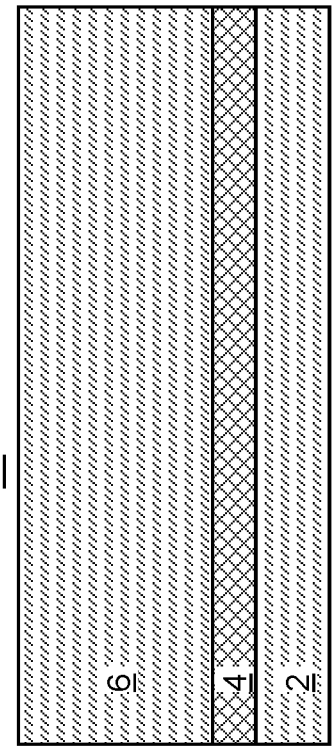
FIG. 2D is a vertical, cross-sectional, magnified view of a region of the exemplary structure along the vertical plane B-B' of FIG. 2C.
Figure 2C:
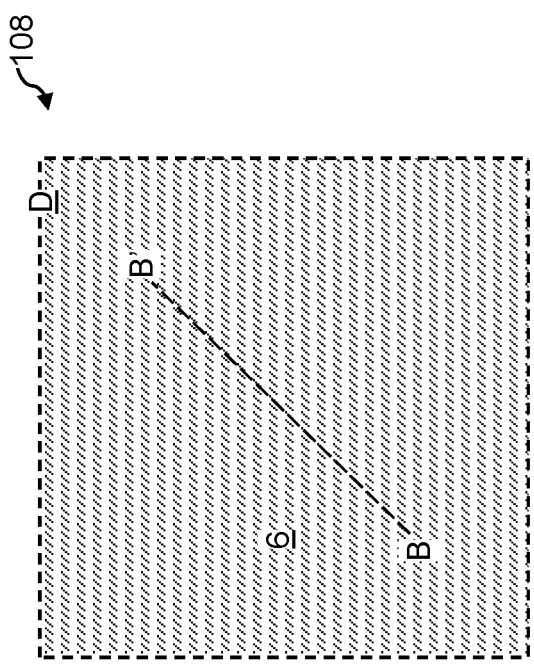
FIG. 2C is a top-down, magnified view of a region D of FIG. 1 after formation of a shallow trench according to an embodiment of the present disclosure.

FIG. 2A is a top-down, magnified view of a region C of FIG. 1 after formation of a shallow trench 11 according to an embodiment of the present disclosure. FIG. 2B is a vertical, cross-sectional, magnified view of a region of the exemplary structure along the vertical plane A-A' of FIG. 2A. FIG. 2C is a top-down, magnified view of a region D of FIG. 1 after formation of a shallow trench 11 according to an embodiment of the present disclosure. FIG. 2D is a vertical, cross-sectional, magnified view of a region of the exemplary structure along the vertical plane B-B' of FIG. 2C. FIG. 2E is a top-down, magnified view of a region F of FIG. 1 after formation of a shallow trench 11 according to an embodiment of the present disclosure. FIG. 2F is a vertical, cross-sectional, magnified view of a region of the exemplary structure along the vertical plane E-E' of FIG. 2E.

Referring to FIGS. 2A-2F, an exemplary structure according to an embodiment of the present disclosure is illustrated. The exemplary structure may include a SOI substrate. The SOI substrate may include a vertical stack of a substrate semiconductor layer 2, a buried insulating layer 4 (e.g., buried oxide layer), a semiconductor material layer 6, a liner layer 8, and a protective layer 10. The substrate semiconductor layer 2 may have a high electrical resistivity to reduce capacitive coupling between the substrate semiconductor layer 2 and the semiconductor material layer 6. The range of the direct-current resistivity of the semiconductor material (such as single crystalline silicon) in the substrate semiconductor layer 2 may be in the range from $3.0\times10^2$ Ω-cm to $3.0\times10^4$ Ω-cm, such as a range from $1.0\times10^3$ Ω-cm to $1.0\times10^4$ Ω-cm. A direct-current resistivity may refer to the resistivity of the material in the under a direct current (DC) electrical bias condition. Such high DC resistivity for the substrate semiconductor layer 2 may be provided by using a single crystalline semiconductor material having a very low level of electrical doping. For example, the substrate semiconductor layer 2 may include single crystalline silicon having an atomic concentration of electrical dopants (which may be p-type dopants or n-type dopants) in a range from $3.0\times10^{11}/cm^3$ to $3.0\times10^{13}/cm^3$, such as a range from $1.0\times10^{12}/cm^3$ to $1.0\times10^{13}/cm^3$. The electrical dopants may be p-type electrical dopants such as boron or n-type electrical dopants such as phosphorus, arsenic, and/or antimony.

The thickness of the substrate semiconductor layer 2 may be selected to provide sufficient mechanical support to layers and structures to be subsequently formed thereupon. In one embodiment, the thickness of the substrate semiconductor layer 2 may be in a range from 100 microns to 2 mm. In one embodiment, the entirety of the substrate semiconductor layer 2 may be single crystalline. In one embodiment, the substrate semiconductor layer 2 may include, and/or may consist of, single crystalline silicon. In one embodiment, the substrate semiconductor layer 2 may include, and/or may consist of, a commercially available silicon substrate having a diameter such as 200 mm, 300 mm, or 450 mm, and having DC resistivity in a range from $3.0\times10^2$ Ω-cm to $3.0\times10^4$ Ω-cm, The buried insulating layer 4 may include an insulating material such as silicon oxide, although other insulating materials are within the contemplated scope of disclosure. In one embodiment, the buried insulating layer 4 may include high quality silicon oxide formed by thermal oxidation of silicon. The thickness of the buried insulating layer 4 may be in a range from 100 nm to 300 nm, although lesser and greater thicknesses may also be used.

The semiconductor material layer 6 may include a single crystalline semiconductor material such as single crystalline silicon. The thickness of the semiconductor material layer 6 may be in a range from 600 nm to 2,000 nm, such as from 800 nm to 1,500 nm, although lesser and greater thicknesses may also be used. The semiconductor material layer 6 may include electrical dopants of a first conductivity type, which may be p-type dopants or n-type dopants. The atomic concentration of the electrical dopants of the first conductivity type in the semiconductor material layer 6 may be in a range from $1\times10^{14}/cm^3$ to $3\times10^{17}/cm^3$, such as from $3\times10^{14}/cm^3$ to $1\times10^{17}/cm^3$, although lesser and greater average dopant concentrations may also be used. The protective layer 10 may include a dielectric material such as silicon nitride.

Shallow trenches 11 may be formed in an upper portion of the semiconductor material layer 6, the liner layer 8, and the protective layer 10. For example, a first hard mask layer 12 may be formed over the top surface of the semiconductor protective layer 10. The first hard mask layer 12 may include a dielectric material such as silicon nitride. A photoresist layer (not shown) may be applied over the first hard mask layer 12, and may be lithographically patterned. The pattern in the photoresist layer may be transferred into the first hard mask layer 12 using an anisotropic etch process such as a reactive ion etch process. The photoresist layer may be removed, for example, by ashing after patterning the first hard mask layer 12. Alternatively, the photoresist layer may be removed after formation of the shallow trenches 11.

The photoresist layer may be used to transfer a pattern to the first hard mask layer 12 similar to the pattern illustrated in FIG. 1 including the protective layer 10. The protective layer 10 may be a placeholder material layer to be subsequently etched, after forming the deep trench, and replaced with outer diameter surface buffer layers within the BCD layout areas. For example, referring to FIG. 2F, the first hard mask layer 12 may be patterned around one or more areas that may subsequently etched to form a shallow trench between the protective layer 10.

The shallow trenches 11 may laterally surround unetched portions of the semiconductor material layer 6, the liner layer 8, and the protective layer 10 that are proximal to the exposed surfaces of the semiconductor material layer 6, the liner layer 8, and the protective layer 10. Such unetched upper portions of the semiconductor material layer 6, the liner layer 8, and the protective layer 10 may be located within the BCD layout areas (e.g., BCD layout areas 104a, 104b, 104c, 104d as described with reference to FIG. 1), and may be subsequently used to form drain regions, source regions, and body contact regions depending on the number of BCD layout areas encapsulated by the shallow trenches 11. The depth of the shallow trenches 11 may be in a range from 150 nm to 800 nm, such as from 200 nm to 600 nm, and/or from 250 nm to 500 nm, although lesser and greater depths may also be used.

Figure 3A:
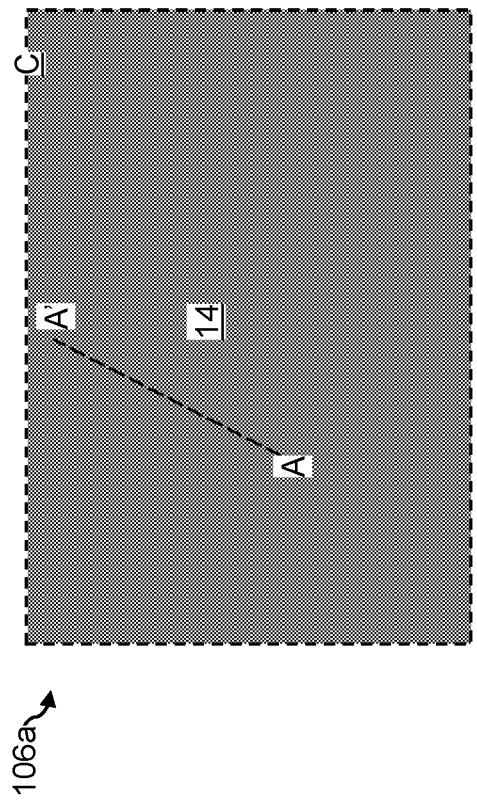
FIG. 3A is a top-down, magnified view of a region C of FIG. 1 after depositing a shallow trench isolation material layer according to an embodiment of the present disclosure.
Figure 3B:
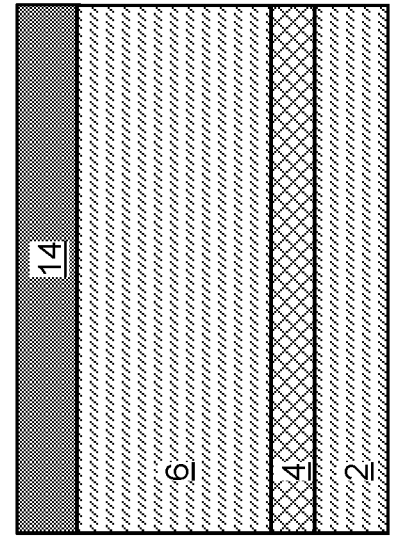
FIG. 3B is a vertical, cross-sectional, magnified view of a region of the exemplary structure along the vertical plane A-A' of FIG. 3A.
Figure 3D:
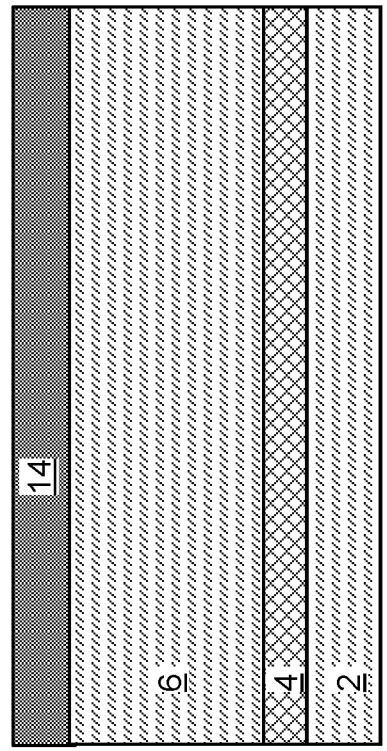
FIG. 3D is a vertical, cross-sectional, magnified view of a region of the exemplary structure along the vertical plane B-B' of FIG. 3C.
Figure 3C:
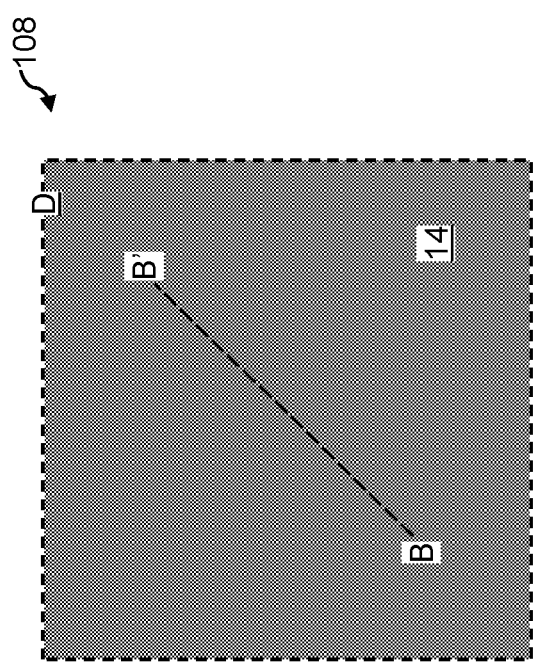
FIG. 3C is a top-down, magnified view of a region D of FIG. 1 after depositing a shallow trench isolation material layer according to an embodiment of the present disclosure.

FIG. 3A is a top-down, magnified view of a region C of FIG. 1 after depositing a shallow trench isolation material layer according to an embodiment of the present disclosure. FIG. 3B is a vertical, cross-sectional, magnified view of a region of the exemplary structure along the vertical plane A-A' of FIG. 3A. FIG. 3C is a top-down, magnified view of a region D of FIG. 1 after depositing a shallow trench isolation material layer according to an embodiment of the present disclosure. FIG. 3D is a vertical, cross-sectional, magnified view of a region of the exemplary structure along the vertical plane B-B' of FIG. 3C. FIG. 3E is a top-down, magnified view of a region F of FIG. 1 after depositing a shallow trench isolation material layer according to an embodiment of the present disclosure. FIG. 3F is a vertical, cross-sectional, magnified view of a region of the exemplary structure along the vertical plane E-E' of FIG. 3E.

Referring to FIGS. 3A-3F, a dielectric fill material such as silicon oxide may be deposited in the shallow trenches 11 by a conformal deposition process such as a chemical vapor deposition (CVD) process. Excess portions of the dielectric fill material may be removed from above the horizontal plane including the top surface of the first hard mask layer 12 by performing a planarization process, which may include a chemical mechanical polishing (CMP) process and/or a recess etch process. Remaining portions of the dielectric fill material may be subsequently recessed, for example, by performing a wet etch process that recesses top surfaces of the remaining portions of the dielectric material approximately down to the horizontal plane including the topmost surface of the protective layer 10. A shallow trench isolation structure 14 may be formed in the shallow trenches. The shallow trench isolation structure 14 may include remaining portions of the dielectric fill material, which may include silicon oxide, although other suitable dielectric fill materials are within the contemplated scope of disclosure. The top surface of the shallow trench isolation structure 14 may be located above, below, or at the horizontal plane including the topmost surface of the protective layer 10. The first hard mask layer 12 may be subsequently removed selective to the materials of the protective layer 10 and the shallow trench isolation structure 14, for example, using a wet etch process. For example, the first hard mask layer 12 may include silicon nitride, and a wet etch process using hot phosphoric acid may be used to remove the first hard mask layer 12. Other hard mask materials and selective etchants are within the contemplated scope of disclosure.

The shallow trench isolation structure 14 may be a single continuous structure or may including multiple shallow trench isolation portions that may be interconnected to one another. For example, the shallow trench isolation structure 14 may include portions surrounding the protective layer 10, in which the protective layer 10 may perform as a placeholder for an outer diameter surface buffer layer within each of BCD areas.

Figure 4A:
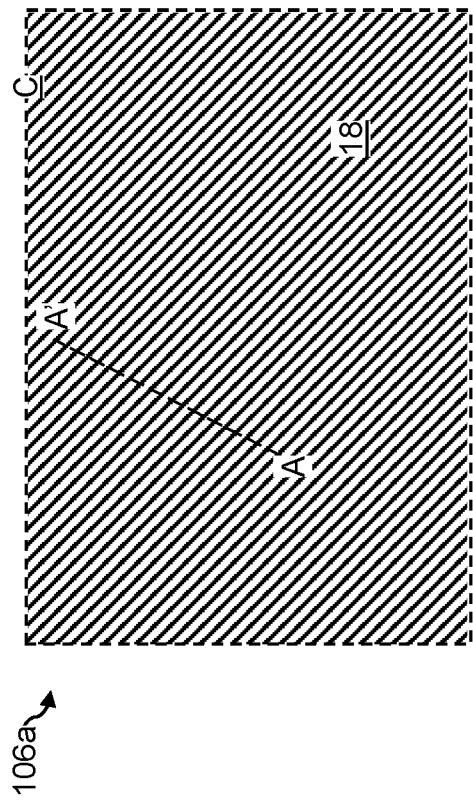
FIG. 4A is a top-down, magnified view of a region C of FIG. 1 after depositing an oxide material layer according to an embodiment of the present disclosure.
Figure 4B:
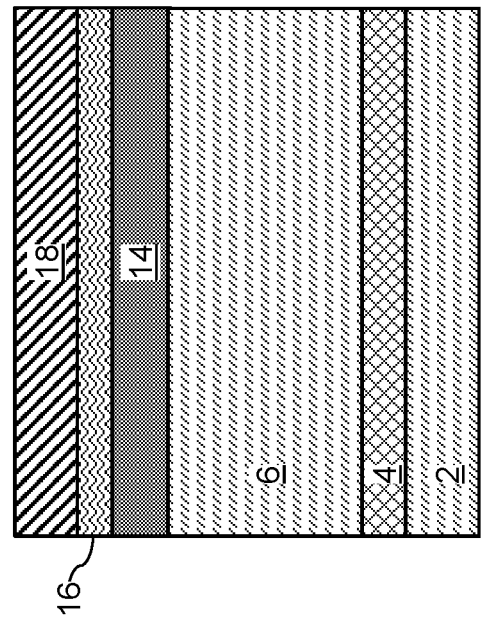
FIG. 4B is a vertical, cross-sectional, magnified view of a region of the exemplary structure along the vertical plane A-A' of FIG. 4A.
Figures 4E, 4F:
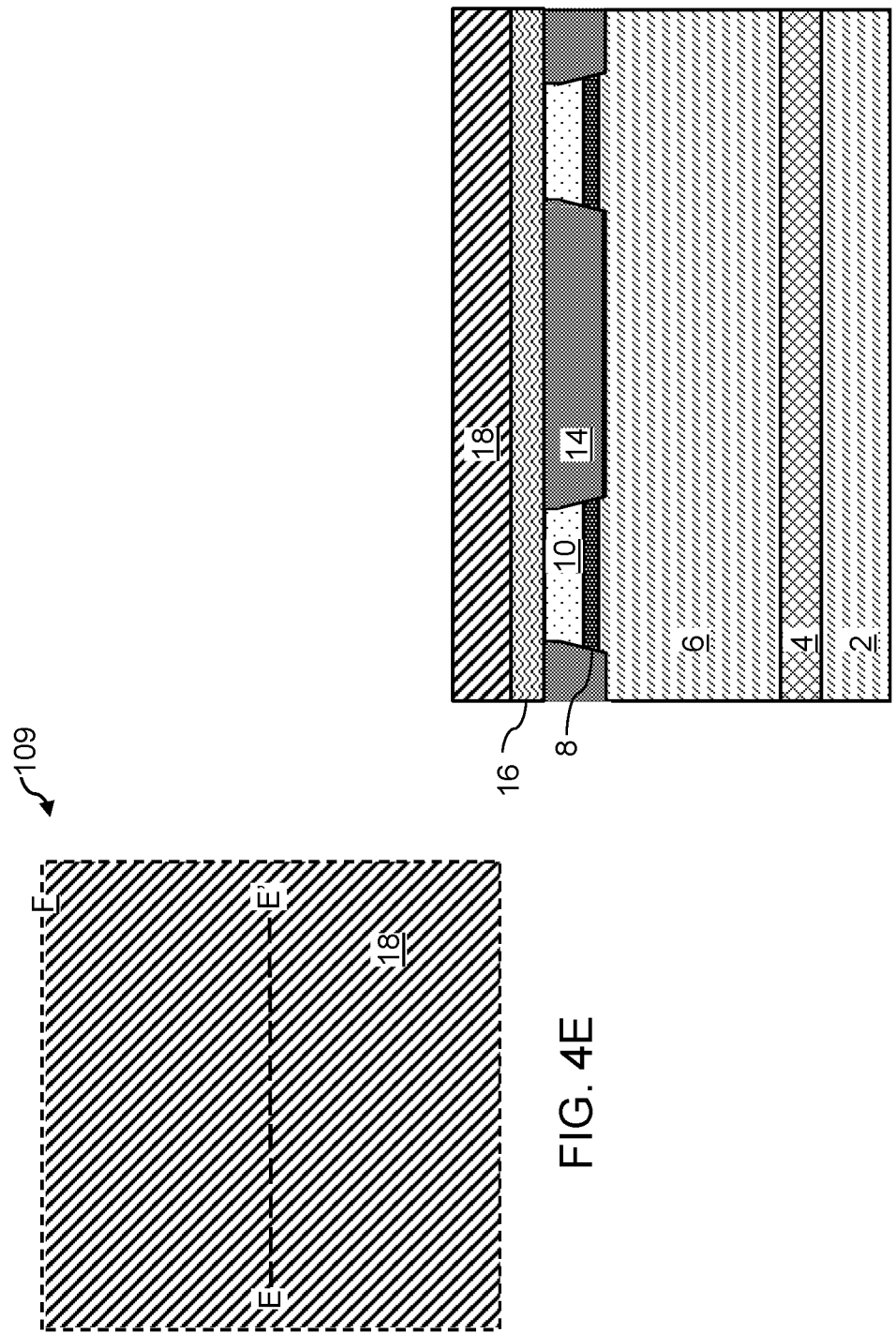
FIG. 4E is a top-down, magnified view of a region F of FIG. 1 after depositing an oxide material layer according to an embodiment of the present disclosure.
FIG. 4F is a vertical, cross-sectional, magnified view of a region of the exemplary structure along the vertical plane E-E' of FIG. 4E.

FIG. 4A is a top-down, magnified view of a region C of FIG. 1 after depositing an oxide material layer 18 according to an embodiment of the present disclosure. FIG. 4B is a vertical, cross-sectional, magnified view of a region of the exemplary structure along the vertical plane A-A' of FIG. 4A. FIG. 4C is a top-down, magnified view of a region D of FIG. 1 after depositing an oxide material layer 18 according to an embodiment of the present disclosure. FIG. 4D is a vertical, cross-sectional, magnified view of a region of the exemplary structure along the vertical plane B-B' of FIG. 4C. FIG. 4E is a top-down, magnified view of a region F of FIG. 1 after depositing an oxide material layer 18 according to an embodiment of the present disclosure. FIG. 4F is a vertical, cross-sectional, magnified view of a region of the exemplary structure along the vertical plane E-E' of FIG. 4E.

Referring to FIGS. 4A-4F, a dielectric layer 16 may be deposited over exposed top surfaces of the protective layer 10 and the shallow trench isolation structure 14 using a suitable deposition process. Herein, suitable deposition processes may include chemical vapor deposition (CVD), physical vapor deposition (PVD), atomic layer deposition (ALD), high density plasma CVD (HDPCVD), metalorganic CVD (MOCVD), plasma enhanced CVD (PECVD), sputtering, laser ablation, or the like. For example, a chemical vapor deposition process may be used to deposit the dielectric layer 16. In one embodiment, the dielectric layer 16 may include silicon nitride. An oxide material layer 18 may be deposited over the dielectric layer 16 using a suitable deposition process. For example, a chemical vapor deposition process may be used to deposit the oxide material layer 18. In one embodiment, the oxide material layer 18 may include undoped silicate glass.

Figures 5E, 5F:
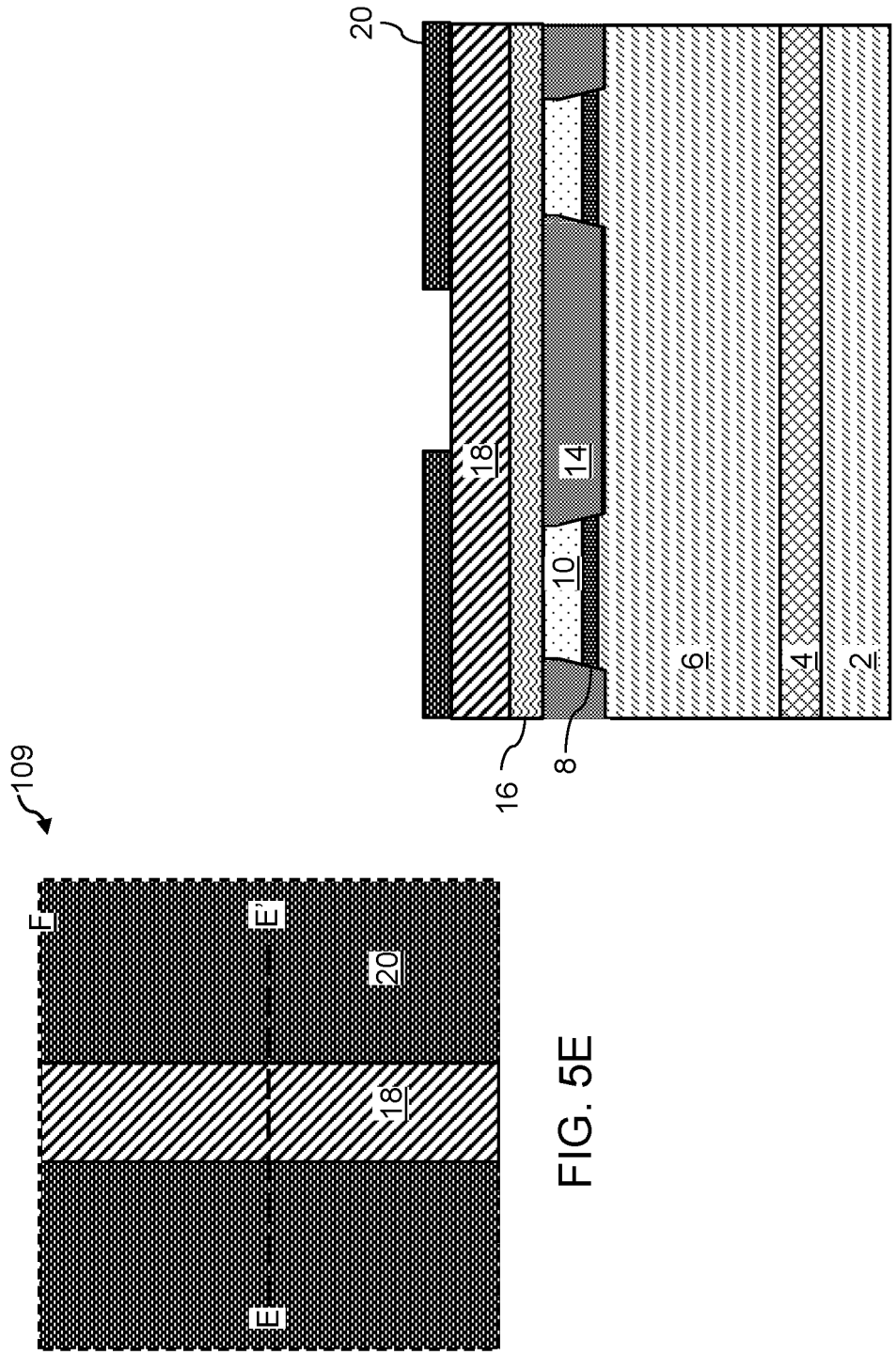
FIG. 5E is a top-down, magnified view of a region F of FIG. 1 after etching a hard mask layer according to an embodiment of the present disclosure.
FIG. 5F is a vertical, cross-sectional, magnified view of a region of the exemplary structure along the vertical plane E-E' of FIG. 5E.

FIG. 5A is a top-down, magnified view of a region C of FIG. 1 after etching a hard mask layer according to an embodiment of the present disclosure. FIG. 5B is a vertical, cross-sectional, magnified view of a region of the exemplary structure along the vertical plane A-A' of FIG. 5A. FIG. 5C is a top-down, magnified view of a region D of FIG. 1 after etching a hard mask layer according to an embodiment of the present disclosure. FIG. 5D is a vertical, cross-sectional, magnified view of a region of the exemplary structure along the vertical plane B-B' of FIG. 5C. FIG. 5E is a top-down, magnified view of a region F of FIG. 1 after etching a hard mask layer according to an embodiment of the present disclosure. FIG. 5F is a vertical, cross-sectional, magnified view of a region of the exemplary structure along the vertical plane E-E' of FIG. 5E.

Referring to FIGS. 5A-5F, a second hard mask layer 20 may be formed over the top surface of the oxide material layer 18. The second hard mask layer 20 may include a dielectric material such as silicon nitride. A photoresist layer (not shown) may be applied over the second hard mask layer 20, and may be lithographically patterned to form at least one opening. The pattern in the photoresist layer may be transferred into the second hard mask layer 20 using an anisotropic etch process such as a reactive ion etch process. The photoresist layer may be removed, for example, by ashing after patterning the second hard mask layer 20. Alternatively, the photoresist layer may be removed after formation of deep trenches.

The photoresist layer may be used to transfer a pattern to the second hard mask layer 20 similar to the pattern illustrated in FIG. 1, in which the second hard mask layer 20 may be patterned to have various curved portions (e.g., "T"-shaped intersections 106*a*, 106*b*, 106*c*, 106*d*, cross-shaped intersection 108, rounded corners 110*a*, 110*b*, 110*c*, 110*d*) from a top-down viewing perspective. Thus, the deep trenches 21 may be etched according to the pattern of the second hard mask layer 20 having curved portions. For example, referring to FIG. 5A, the first hard mask layer 12 may be patterned in a "T"-shaped intersection having curved portions at the intersection of the horizontal and vertical segments. As another example, referring to FIG. 5C, the second hard mask layer 20 may be patterned in a cross-shaped intersection having curved portions at the intersection of the horizontal and vertical segments. As a further example, referring to FIG. 5E, the second hard mask layer 20 may be patterned in a straight parallel shape usable for forming vertical portions (e.g., vertical portion 109) and horizontal portions that may connect "T"-shaped intersections 106a, 106b, 106c, 106d, the cross-shaped intersection 108, and the rounded corners 110a, 110b, 110c, 110d.

The second hard mask layer 20 may be formed to have an opening that is smaller than the opening formed by the first hard mask layer 12 as described with reference to FIGS. 2A-2E. Thus, deep trenches ultimately formed through the second hard mask layer 20 may have a lesser width than the shallow trenches 11 formed through the first hard mask layer 12.

Figures 6A, 6B:
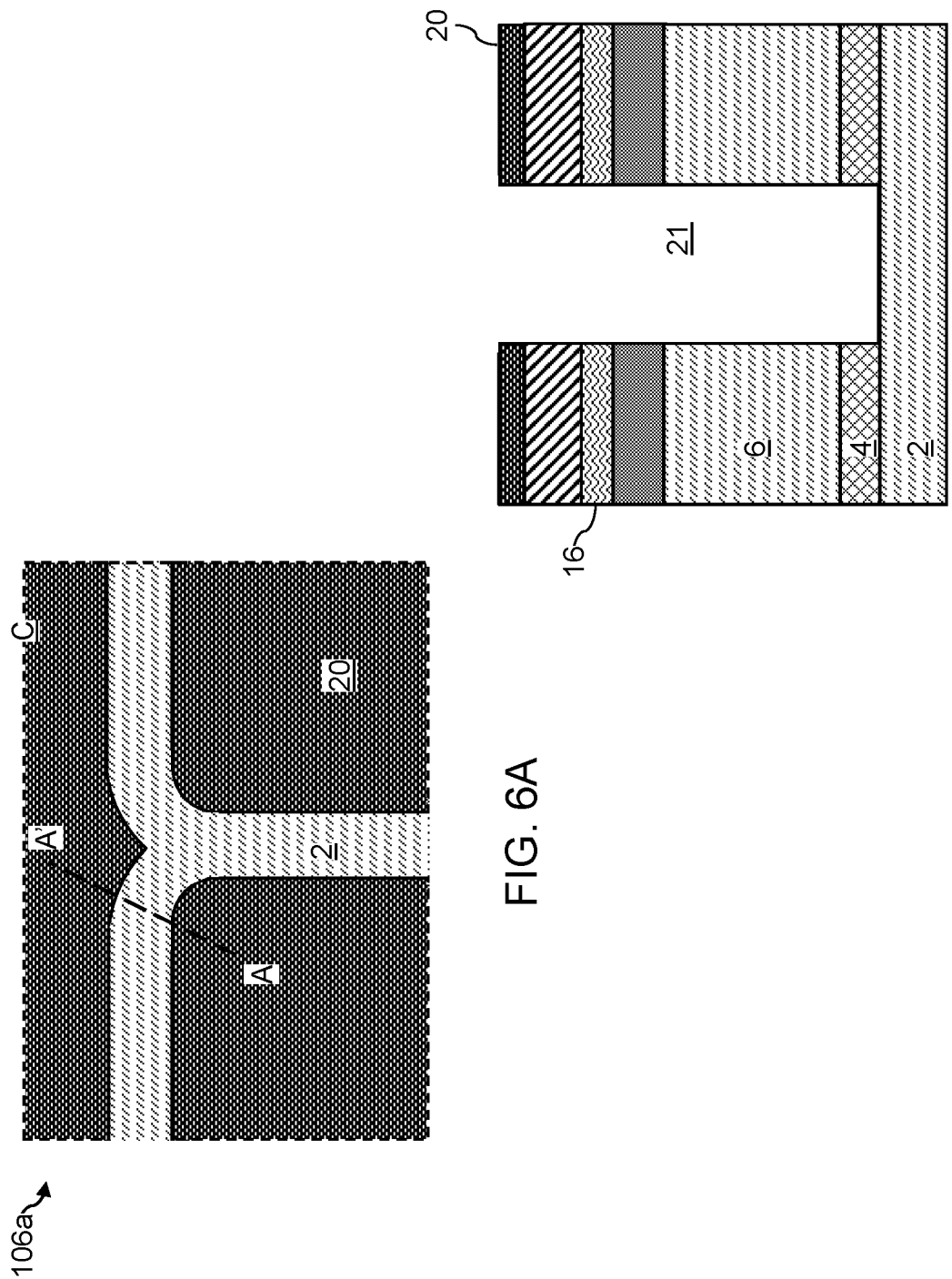
FIG. 6A is a top-down, magnified view of a region C of FIG. 1 after etching a deep trench according to an embodiment of the present disclosure.
FIG. 6B is a vertical, cross-sectional, magnified view of a region of the exemplary structure along the vertical plane A-A' of FIG. 6A.

FIG. 6A is a top-down, magnified view of a region C of FIG. 1 after etching a deep trench 21 according to an embodiment of the present disclosure. FIG. 6B is a vertical, cross-sectional, magnified view of a region of the exemplary structure along the vertical plane A-A' of FIG. 6A. FIG. 6C is a top-down, magnified view of a region D of FIG. 1 after etching a deep trench 21 according to an embodiment of the present disclosure. FIG. 6D is a vertical, cross-sectional, magnified view of a region of the exemplary structure along the vertical plane B-B' of FIG. 6C. FIG. 6E is a top-down, magnified view of a region F of FIG. 1 after etching a deep trench 21 according to an embodiment of the present disclosure. FIG. 6F is a vertical, cross-sectional, magnified view of a region of the exemplary structure along the vertical plane E-E' of FIG. 6E.

Referring to FIGS. 6A-6F, an anisotropic etch process may be performed to transfer the pattern in the second hard mask layer 20 through the oxide material layer 18, the dielectric layer 16, the shallow trench isolation structure 14, an underlying portion of the semiconductor material layer 6, an underlying portion of the buried insulating layer 4, and into an upper portion of the substrate semiconductor layer 2. A deep trench 21 may be formed as a continuous cavity formed by removal of the materials not covered by the second hard mask layer 20 (i.e., the oxide material layer 18, the dielectric layer 16, the shallow trench isolation structure 14, an underlying portion of the semiconductor material layer 6, an underlying portion of the buried insulating layer 4, and an upper portion of the substrate semiconductor layer 2). The depth of the deep trench 21 may be in a range from 700 nm to 2,500 nm, such as from 1,000 nm to 2,000 nm, although lesser and greater depths may also be used. An upper region of the deep trench 21 may be laterally surrounded by remaining portions of the shallow trench isolation structure 14.

A central node 33, or island structure, may be formed during the etching process to form the deep trench 21. The cross-shaped intersection 108 may include the central node 33 around which the deep trench 21 may be etched. The central node 33 may be etched to be centrally positioned within an intersection of two vertical portions and two horizontal portions of the deep trench isolation structure 102. The central node 33 may include a layer stack including unetched portions of the buried insulating layer 4 (e.g., buried oxide layer), the semiconductor material layer 6, and the shallow trench isolation structure 14.

Figure 7A:
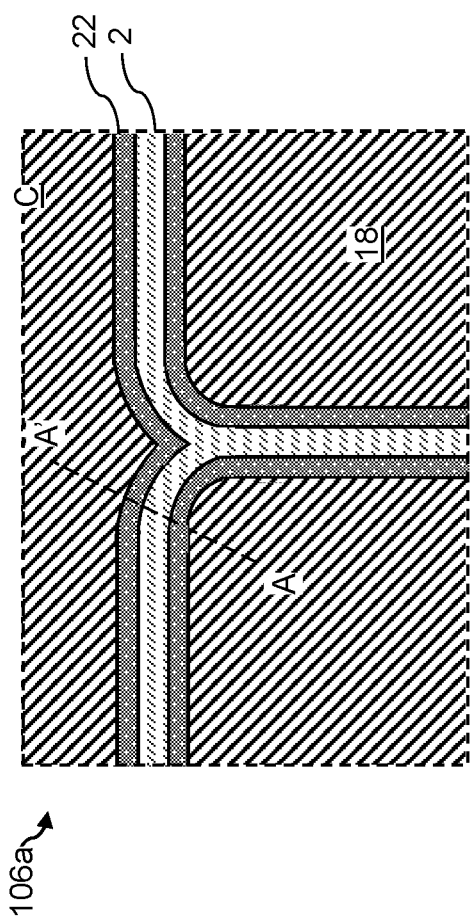
FIG. 7A is a top-down, magnified view of a region C of FIG. 1 after forming deep trench isolation sidewalls according to an embodiment of the present disclosure.
Figure 7B:
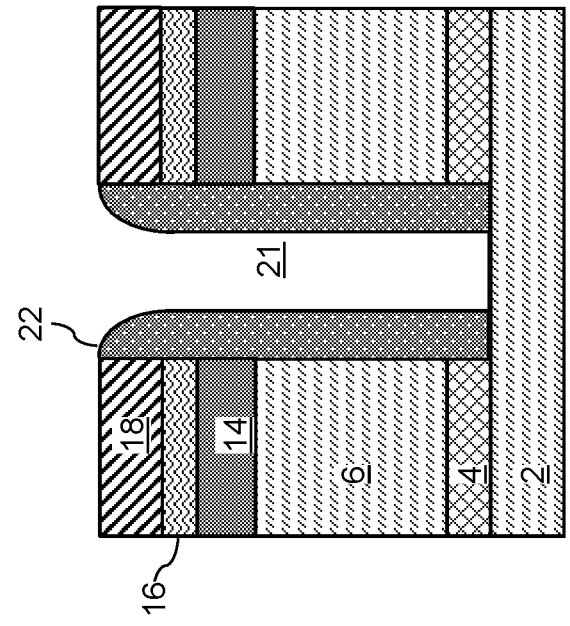
FIG. 7B is a vertical, cross-sectional, magnified view of a region of the exemplary structure along the vertical plane A-A' of FIG. 7A.

FIG. 7A is a top-down, magnified view of a region C of FIG. 1 after forming deep trench isolation sidewalls 22 according to an embodiment of the present disclosure. FIG. 7B is a vertical, cross-sectional, magnified view of a region of the exemplary structure along the vertical plane A-A' of FIG. 7A. FIG. 7C is a top-down, magnified view of a region D of FIG. 1 after forming deep trench isolation sidewalls 22 according to an embodiment of the present disclosure. FIG. 7D is a vertical, cross-sectional, magnified view of a region of the exemplary structure along the vertical plane B-B' of FIG. 7C. FIG. 7E is a top-down, magnified view of a region F of FIG. 1 after forming deep trench isolation sidewalls 22 according to an embodiment of the present disclosure. FIG. 7F is a vertical, cross-sectional, magnified view of a region of the exemplary structure along the vertical plane E-E' of FIG. 7E.

Referring to FIGS. 7A-7F, a dielectric material layer such as a silicon oxide layer may be conformally deposited in each deep trench 21 and over the oxide material layer 18 using a suitable deposition process. For example, a chemical vapor deposition process may be used to deposit the dielectric material layer. The thickness of the dielectric material layer may be in a range from 30 nm to 300 nm, such as from 60 nm to 150 nm, although lesser and greater thicknesses may also be used. In one embodiment, the thickness of the dielectric material layer may be less than one half of the width of a bottom surface of the deep trench 21. An anisotropic etch process may be performed to remove horizontally-extending portions of the dielectric material layer (e.g., over the oxide material layer 18). Each remaining vertically-extending portion of the dielectric material layer constitutes a deep trench isolation sidewall 22, which may also be referred to as a deep trench spacer or a dielectric spacer. In one embodiment, a liner oxide layer may be deposited before the dielectric material layer used to form the deep trench isolation sidewalls 22. The liner oxide may have a thickness ranging from 90 A to 110 A, although lesser and greater thicknesses may also be used. In one embodiment, each deep trench isolation sidewall 22 may have a thickness ranging from 6000 A to 8000 A, although lesser and greater thicknesses may also be used.

FIG. 8A is a top-down, magnified view of a region C of FIG. 1 after performing ion implantation according to an embodiment of the present disclosure. FIG. 8B is a vertical, cross-sectional, magnified view of a region of the exemplary structure along the vertical plane A-A' of FIG. 8A. FIG. 8C is a top-down, magnified view of a region D of FIG. 1 after performing ion implantation according to an embodiment of the present disclosure. FIG. 8D is a vertical, cross-sectional, magnified view of a region of the exemplary structure along the vertical plane B-B' of FIG. 8C. FIG. 8E is a top-down, magnified view of a region F of FIG. 1 after performing ion implantation according to an embodiment of the present disclosure. FIG. 8F is a vertical, cross-sectional, magnified view of a region of the exemplary structure along the vertical plane E-E' of FIG. 8E.

Referring to FIGS. 8A-8F, an ion implantation process may be performed to implant electrical dopants into an upper portion of the substrate semiconductor layer 2. The ion implantation process may include a masked ion implantation process that may be performed to implant dopants into an upper portion of the substrate semiconductor layer 2. For example, an implantation mask (not shown) may be formed to cover the oxide material layer 18 and the deep trench isolation sidewalls 22. The implantation mask may be a patterned photoresist layer. Dopants (e.g., Boron) may be implanted into substrate semiconductor layer 2 to form a doped well 24. The implantation mask may be subsequently removed, for example, by ashing. A rapid thermal annealing process may be performed on the doped well 24 after doping the substrate semiconductor layer 2.

Figure 9A:
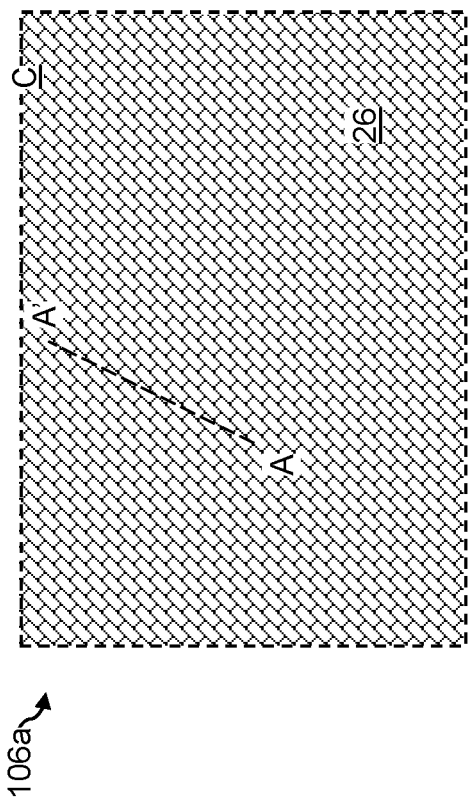
FIG. 9A is a top-down, magnified view of a region C of FIG. 1 after depositing a polysilicon layer according to an embodiment of the present disclosure.
Figure 9B:
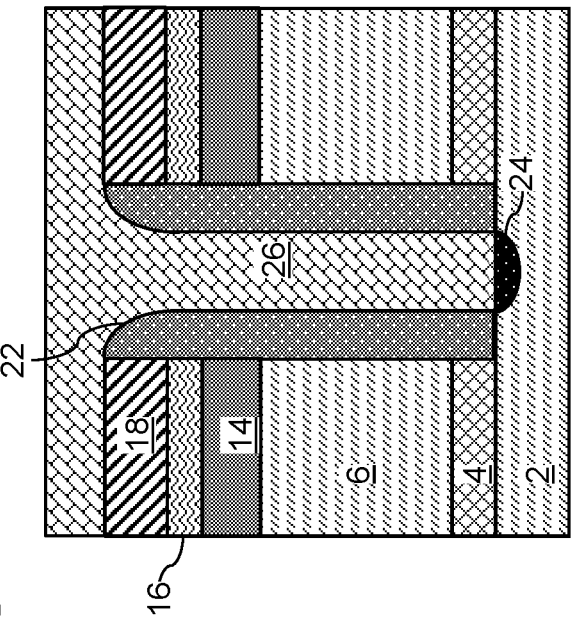
FIG. 9B is a vertical, cross-sectional, magnified view of a region of the exemplary structure along the vertical plane A-A' of FIG. 9A.
Figures 9C, 9D:
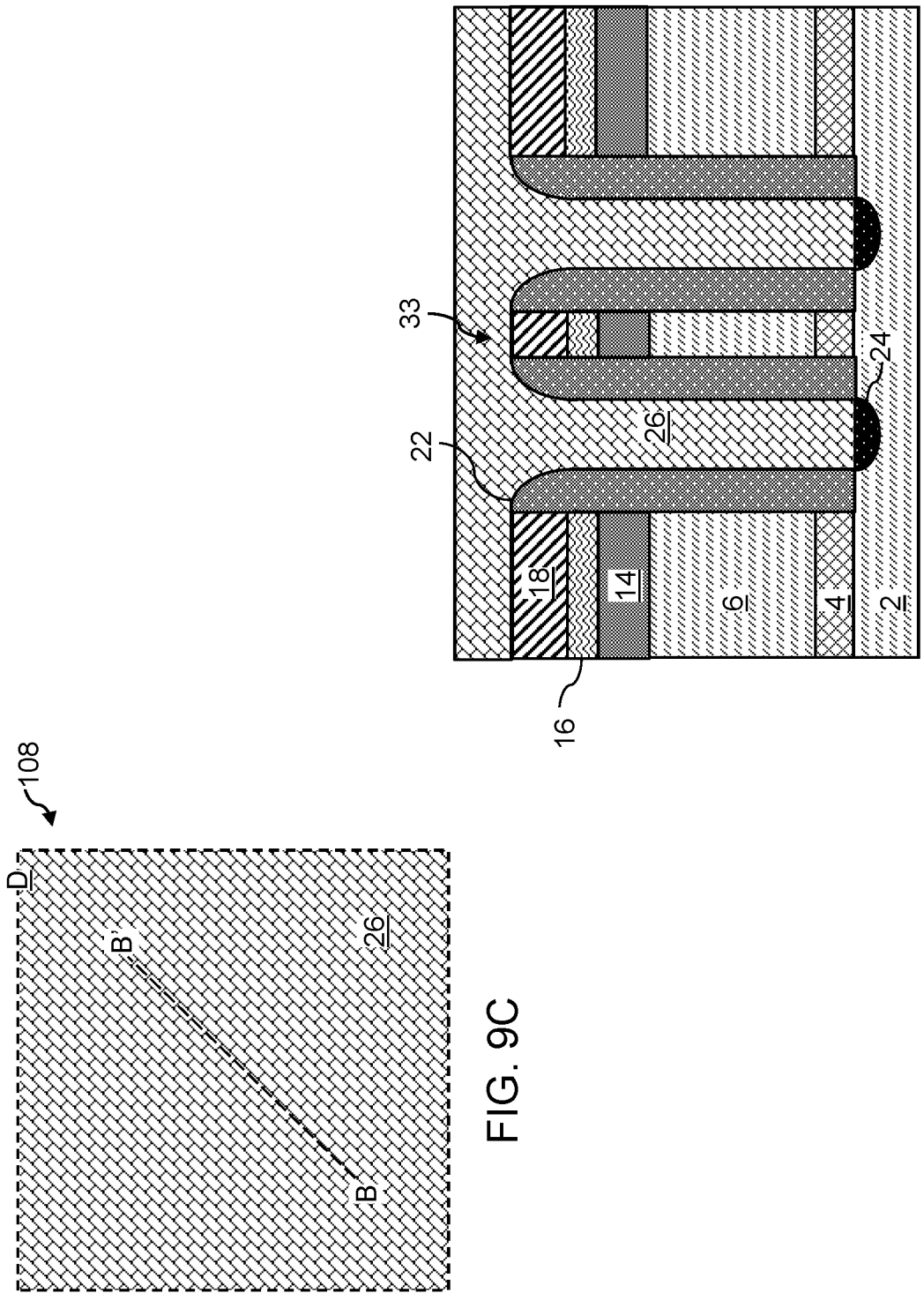
FIG. 9C is a top-down, magnified view of a region D of FIG. 1 after depositing a polysilicon layer according to an embodiment of the present disclosure.
FIG. 9D is a vertical, cross-sectional, magnified view of a region of the exemplary structure along the vertical plane B-B' of FIG. 9C.

FIG. 9A is a top-down, magnified view of a region C of FIG. 1 after depositing a polysilicon layer 26 according to an embodiment of the present disclosure. FIG. 9B is a vertical, cross-sectional, magnified view of a region of the exemplary structure along the vertical plane A-A' of FIG. 9A. FIG. 9C is a top-down, magnified view of a region D of FIG. 1 after depositing a polysilicon layer 26 according to an embodiment of the present disclosure. FIG. 9D is a vertical, cross-sectional, magnified view of a region of the exemplary structure along the vertical plane B-B' of FIG. 9C. FIG. 9E is a top-down, magnified view of a region F of FIG. 1 after depositing a polysilicon layer 26 according to an embodiment of the present disclosure. FIG. 9F is a vertical, cross-sectional, magnified view of a region of the exemplary structure along the vertical plane E-E' of FIG. 9E.

Referring to FIGS. 9A-9F, the polysilicon layer 26 may be deposited over exposed top surfaces of the doped well 24, the oxide material layer 18, and the deep trench isolation sidewalls 22 using a suitable deposition process. In some embodiments, at least one conductive material (not shown) such as heavily doped amorphous silicon or heavily doped polysilicon may be deposited in the remaining volume of each deep trench 21 by a conformal deposition process such as a chemical vapor deposition process. The thickness of the deposited conductive material layer may be selected such that the entire volume of each deep trench 21 is filled with a combination of the polysilicon layer 26 and the at least one conductive material.

Figure 10A:
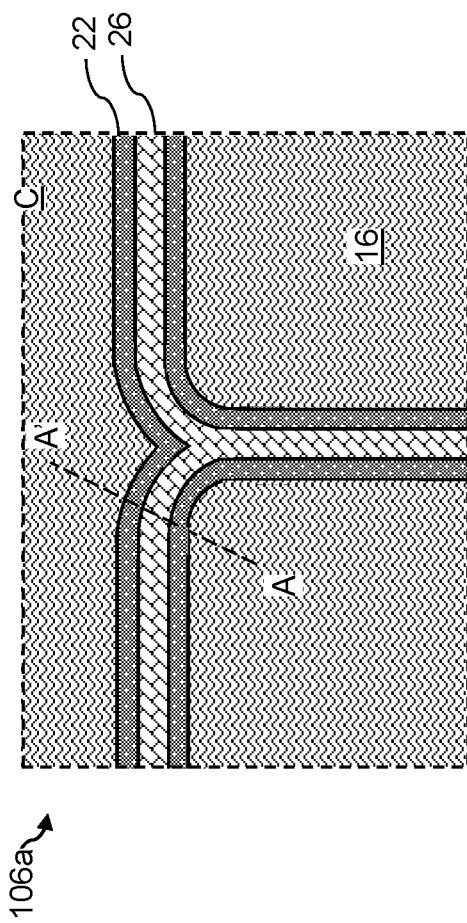
FIG. 10A is a top-down, magnified view of a region C of FIG. 1 after performing a chemical mechanical polishing process according to an embodiment of the present disclosure.
Figure 10B:
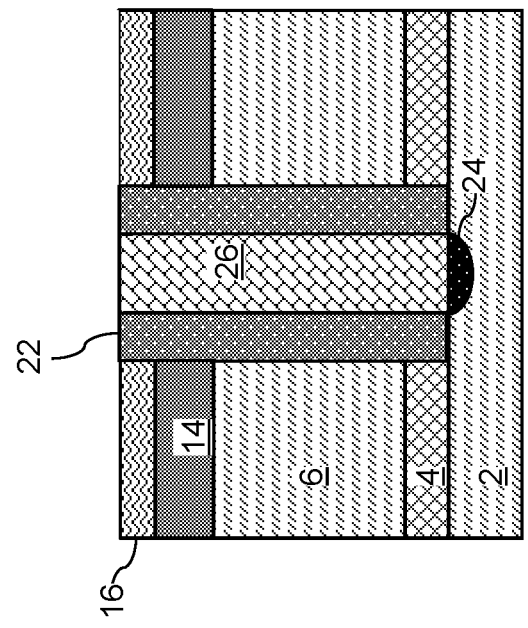
FIG. 10B is a vertical, cross-sectional, magnified view of a region of the exemplary structure along the vertical plane A-A' of FIG. 10A.
Figure 10D:
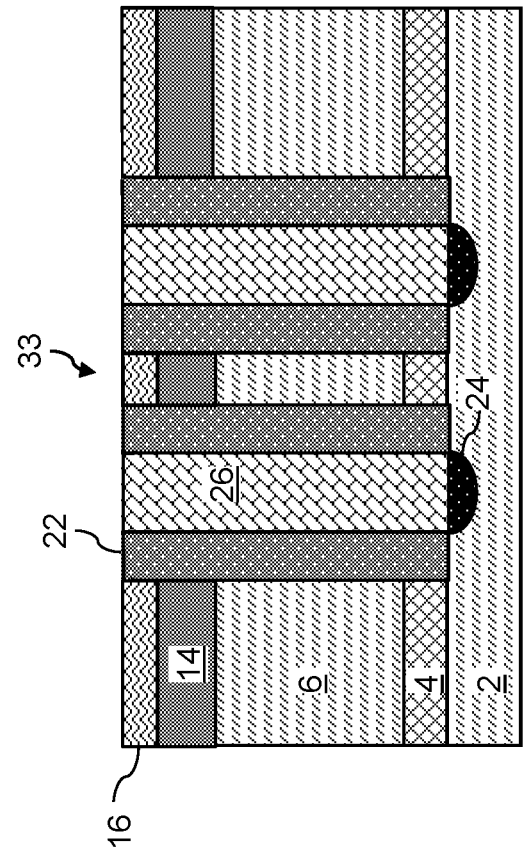
FIG. 10D is a vertical, cross-sectional, magnified view of a region of the exemplary structure along the vertical plane B-B' of FIG. 10C.
Figure 10C:
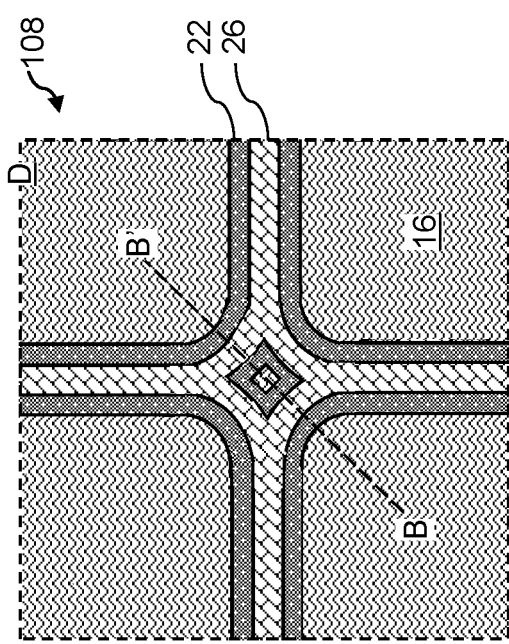
FIG. 10C is a top-down, magnified view of a region D of FIG. 1 after performing a chemical mechanical polishing process according to an embodiment of the present disclosure.
Figures 10E, 10F:
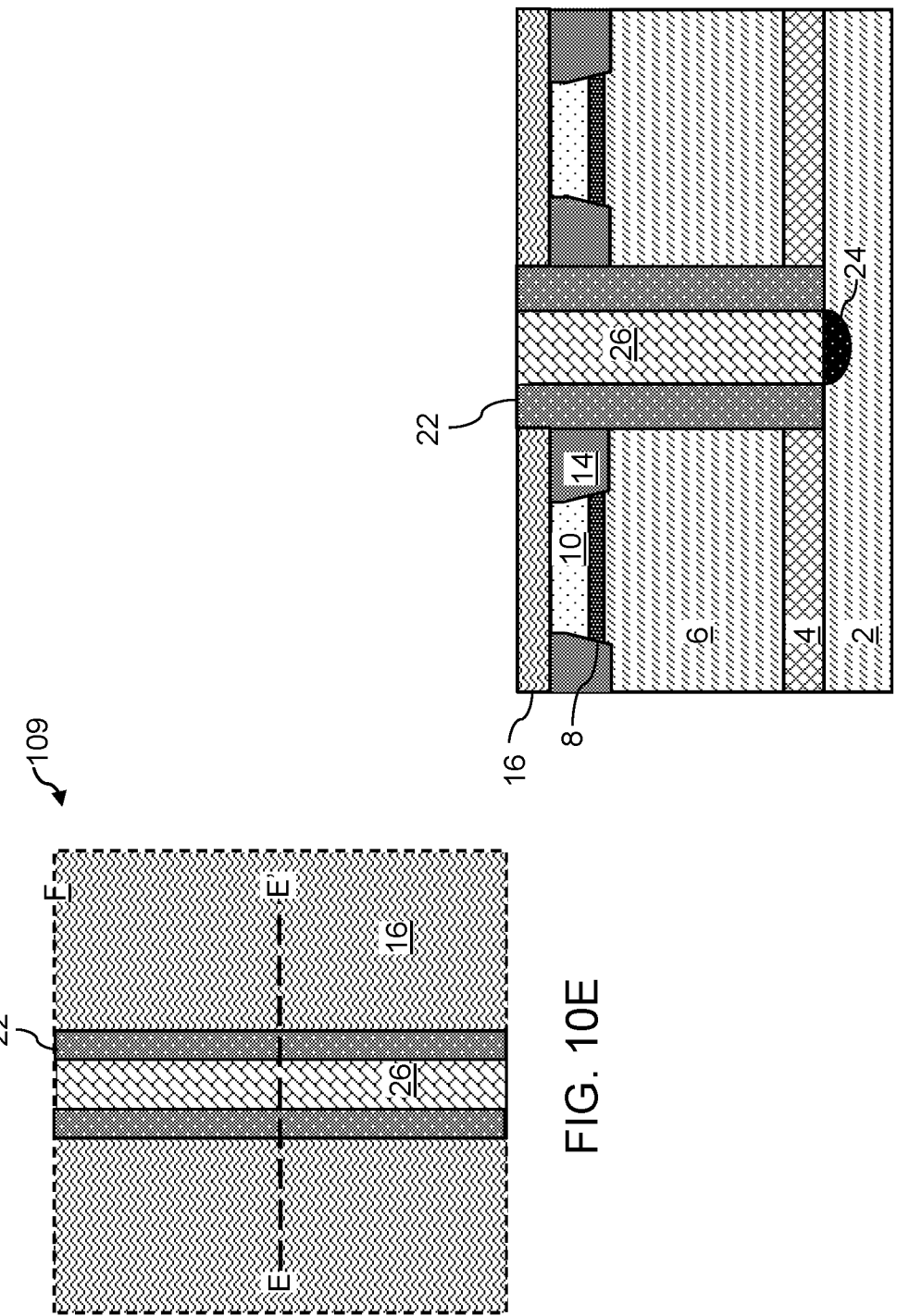
FIG. 10E is a top-down, magnified view of a region F of FIG. 1 after performing a chemical mechanical polishing process according to an embodiment of the present disclosure.
FIG. 10F is a vertical, cross-sectional, magnified view of a region of the exemplary structure along the vertical plane E-E' of FIG. 10E.

FIG. 10A is a top-down, magnified view of a region C of FIG. 1 after performing a chemical mechanical polishing process according to an embodiment of the present disclosure. FIG. 10B is a vertical, cross-sectional, magnified view of a region of the exemplary structure along the vertical plane A-A' of FIG. 10A. FIG. 10C is a top-down, magnified view of a region D of FIG. 1 after performing a chemical mechanical polishing process according to an embodiment of the present disclosure. FIG. 10D is a vertical, cross-sectional, magnified view of a region of the exemplary structure along the vertical plane B-B' of FIG. 10C. FIG. 10E is a top-down, magnified view of a region F of FIG. 1 after performing a chemical mechanical polishing process according to an embodiment of the present disclosure. FIG. 10F is a vertical, cross-sectional, magnified view of a region of the exemplary structure along the vertical plane E-E' of FIG. 10E.

Referring to FIGS. 10A-10F, top portions of the oxide material layer 18, and the deep trench isolation sidewalls 22, and the polysilicon layer 26 may be removed using a CMP process. The CMP process may remove the oxide material layer in full, may remove top, curved portions of the deep trench isolation sidewalls 22, and may remove polysilicon layer 26 excess material above the dielectric layer 16 and the deep trench isolation sidewalls 22. The CMP process may planarize the deep trench isolation sidewalls 22 and the polysilicon layer 26 with the top surface of the dielectric layer 16. In some embodiments, the top surface of the dielectric layer 16 may be polished during the CMP process.

Figure 11A:
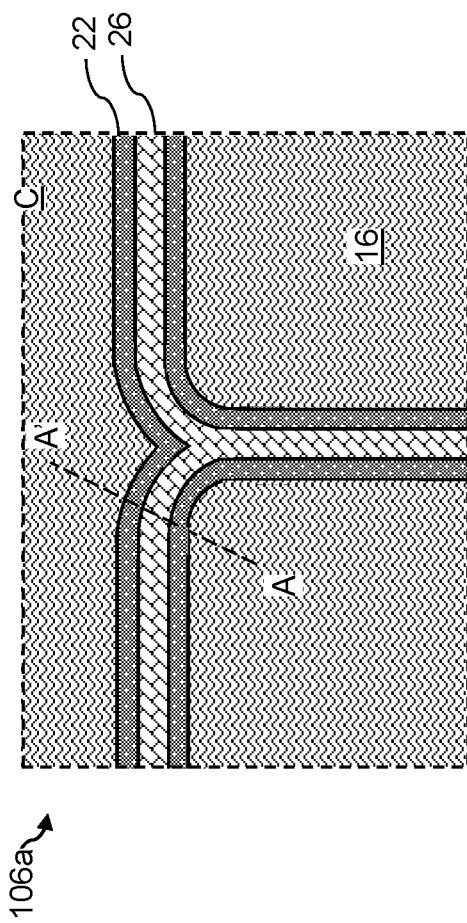
FIG. 11A is a top-down, magnified view of a region C of FIG. 1 after performing an etch back process according to an embodiment of the present disclosure.
Figure 11B:
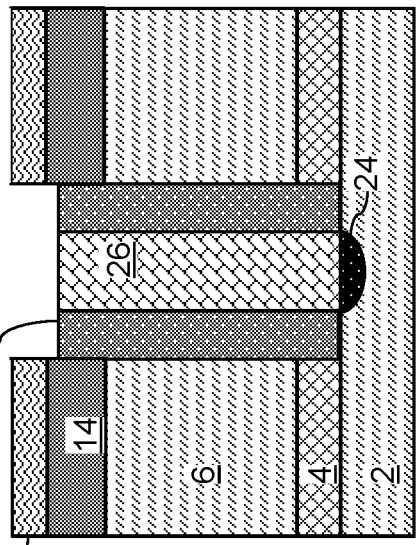
FIG. 11B is a vertical, cross-sectional, magnified view of a region of the exemplary structure along the vertical plane A-A' of FIG. 11A.
Figure 11D:
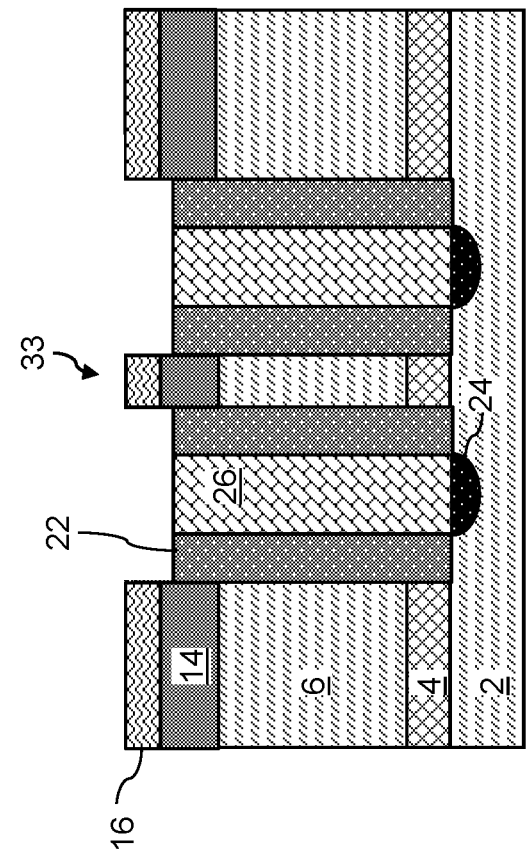
FIG. 11D is a vertical, cross-sectional, magnified view of a region of the exemplary structure along the vertical plane B-B' of FIG. 11C.
Figure 11C:
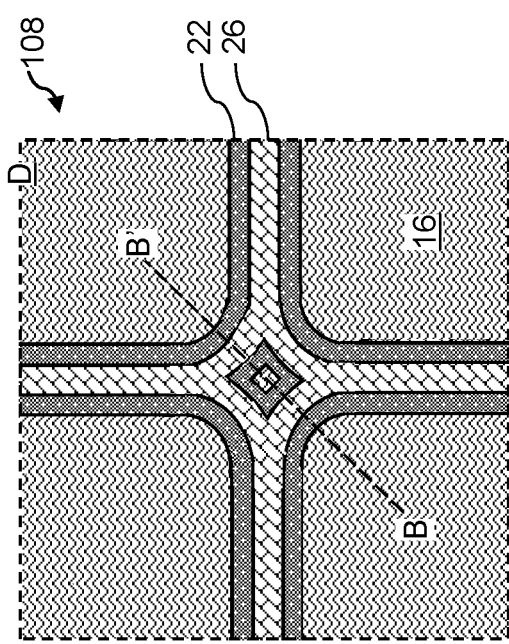
FIG. 11C is a top-down, magnified view of a region D of FIG. 1 after performing an etch back process according to an embodiment of the present disclosure.
Figures 11E, 11F:
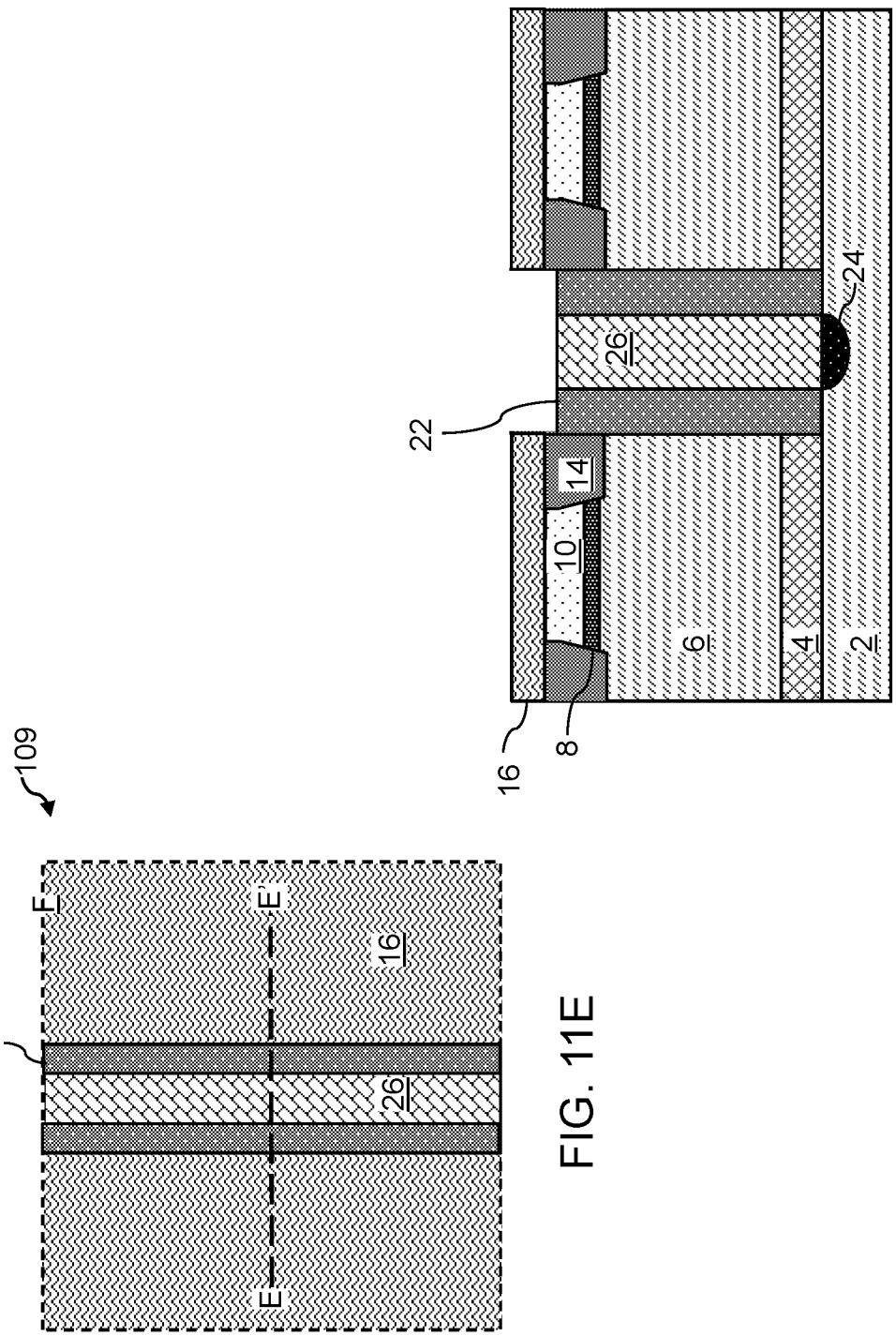
FIG. 11E is a top-down, magnified view of a region F of FIG. 1 after performing an etch back process according to an embodiment of the present disclosure.
FIG. 11F is a vertical, cross-sectional, magnified view of a region of the exemplary structure along the vertical plane E-E' of FIG. 11E.

FIG. 11A is a top-down, magnified view of a region C of FIG. 1 after performing an etch back process according to an embodiment of the present disclosure. FIG. 11B is a vertical, cross-sectional, magnified view of a region of the exemplary structure along the vertical plane A-A' of FIG. 11A. FIG. 11C is a top-down, magnified view of a region D of FIG. 1 after performing an etch back process according to an embodiment of the present disclosure. FIG. 11D is a vertical, cross-sectional, magnified view of a region of the exemplary structure along the vertical plane B-B' of FIG. 11C. FIG. 11E is a top-down, magnified view of a region F of FIG. 1 after performing an etch back process according to an embodiment of the present disclosure. FIG. 11F is a vertical, cross-sectional, magnified view of a region of the exemplary structure along the vertical plane E-E' of FIG. 11E.

Referring to FIGS. 11A-11F, portions of the deep trench isolation sidewalls 22 and the polysilicon layer 26 may be removed, for example, by performing a recess etch process, or an etch back process. The recess etch process may use a wet etch process or a reactive ion etch process, such as an isotropic etch process. The recess etch process may remove portions of the deep trench isolation sidewalls 22 and the polysilicon layer 26 such that the top surfaces of the recess-etched deep trench isolation sidewalls 22 and the polysilicon layer 26 may be on a same horizontal plane as a sidewall of the shallow trench isolation structure 14.

Figure 12A:
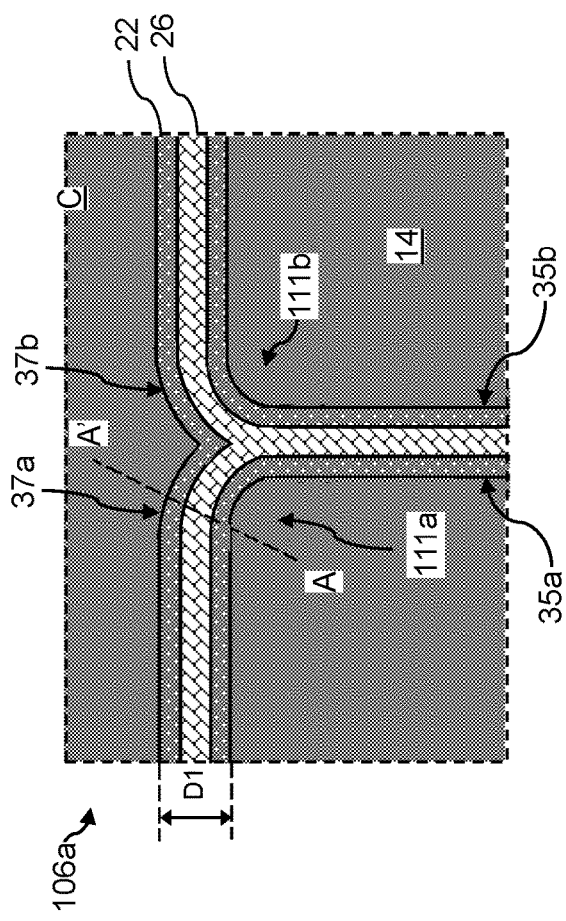
FIG. 12A is a top-down, magnified view of a region C of FIG. 1 after removing a protective layer according to an embodiment of the present disclosure.
Figure 12B:
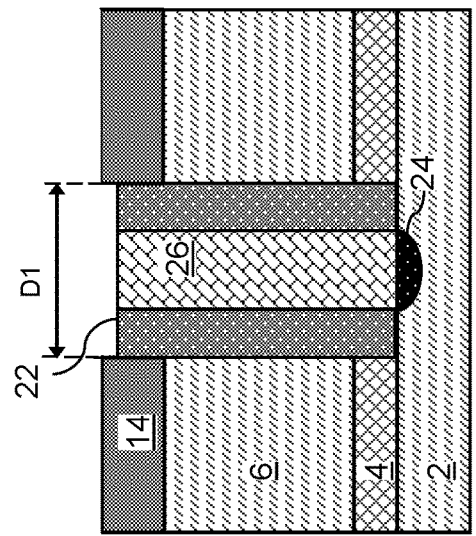
FIG. 12B is a vertical, cross-sectional, magnified view of a region of the exemplary structure along the vertical plane A-A' of FIG. 12A.
Figure 12C:
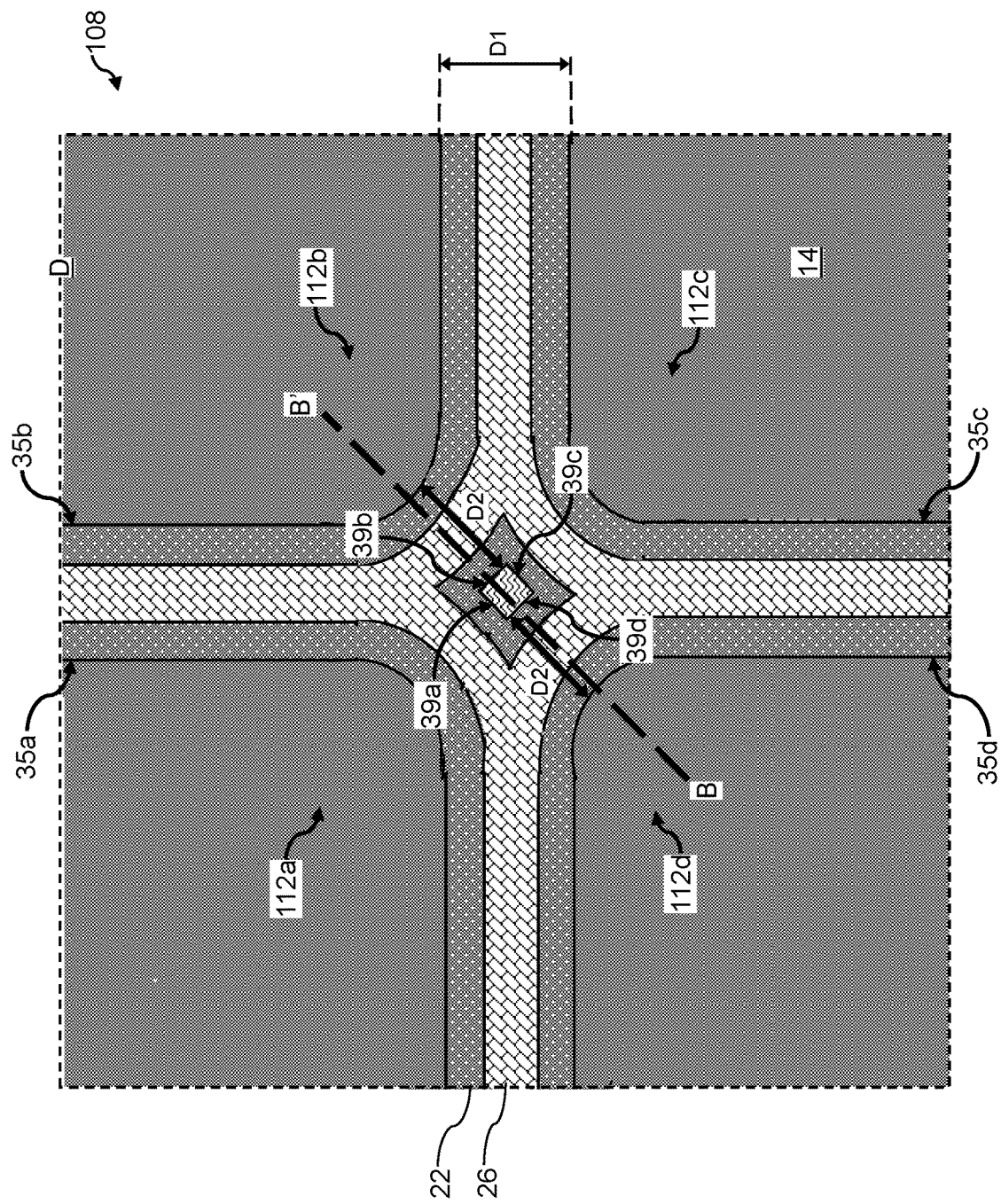
FIG. 12C is a top-down, magnified view of a region D of FIG. 1 after removing a protective layer according to an embodiment of the present disclosure.
Figure 12D:
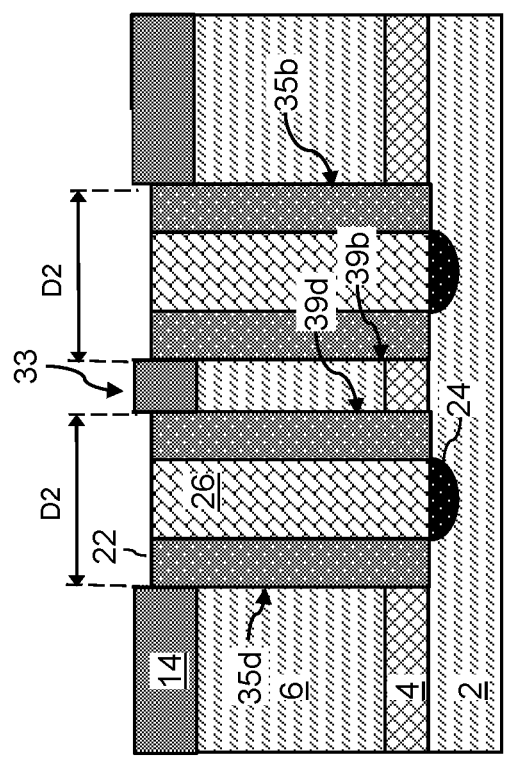
FIG. 12D is a vertical, cross-sectional, magnified view of a region of the exemplary structure along the vertical plane B-B' of FIG. 12C.
Figure 12E:
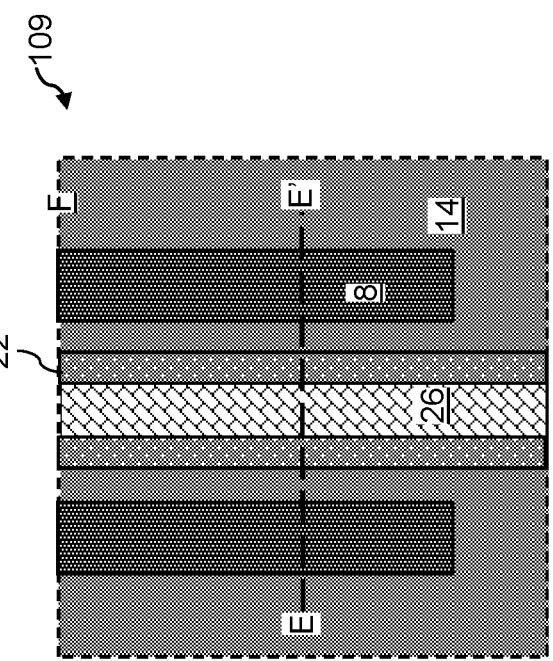
FIG. 12E is a top-down, magnified view of a region F of FIG. 1 after removing a protective layer according to an embodiment of the present disclosure.
Figure 12F:
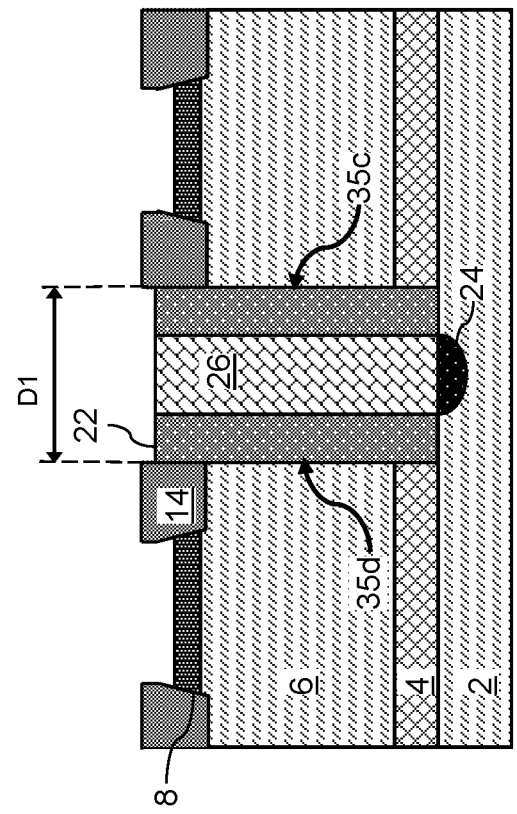
FIG. 12F is a vertical, cross-sectional, magnified view of a region of the exemplary structure along the vertical plane E-E' of FIG. 12E.

FIG. 12A is a top-down, magnified view of a region C of FIG. 1 after removing a protective layer according to an embodiment of the present disclosure. FIG. 12B is a vertical, cross-sectional, magnified view of a region of the exemplary structure along the vertical plane A-A' of FIG. 12A. FIG. 12C is a top-down, magnified view of a region D of FIG. 1 after removing a protective layer according to an embodiment of the present disclosure. FIG. 12D is a vertical, cross-sectional, magnified view of a region of the exemplary structure along the vertical plane B-B' of FIG. 12C. FIG. 12E is a top-down, magnified view of a region F of FIG. 1 after removing a protective layer according to an embodiment of the present disclosure. FIG. 12F is a vertical, cross-sectional, magnified view of a region of the exemplary structure along the vertical plane E-E' of FIG. 12E.

Referring to FIGS. 12A-12F, the protective layer 10 and the dielectric layer 16 may be subsequently removed selective to the materials of the shallow trench isolation structure 14, the deep trench isolation sidewalls 22, and the polysilicon layer 26, for example, using a wet etch process. For example, protective layer 10 and the dielectric layer 16 may include silicon nitride, and a wet etch process using hot phosphoric acid may be used to remove the protective layer 10 and the dielectric layer 16. Removal of the protective layer 10 and the dielectric layer 16 may expose a top surface of the liner layer 8. Following the removal of the protective layer 10 and the dielectric layer 16, techniques and manufacturing processes may be implemented to complete formation of the deep trench isolation structure in accordance with various BCD devices surrounded by the deep trench isolation structure. For example, the structure as illustrated in FIGS. 12B and 12D may be a foundational structure used to form a deep trench isolation structure adjacent to and surrounding various BCD device structures that may be formed over the semiconductor material layer 6 (i.e., within BCD layout areas 104a, 104b, 104c, 104d).

With reference to FIGS. 1, 12A, and 12B, the deep trench isolation structure 102 may include inner sidewalls 35a, 35b, and outer sidewalls 37a and 37b having dimensions defined by the dimensions of the previously etched deep trench 21. The first inner sidewall 35a may define the shape of the first BCD layout area 104a, and the second inner sidewall 35b may define the shape of the second BCD layout area 104b. For example, the first inner sidewall 35a may define a shape of the first BCD layout area 104a including the rounded corners (e.g., "T"-shaped intersection rounded corners 111a, 111h, first cross-shaped intersection rounded corner 112a, first rounded corner 110a). The first outer sidewall 37a may be equidistant from the first inner sidewall 35a around the first BCD layout area 104a, in which the first outer sidewall 37a has a same radius of curvature as the first inner sidewall 35a at the rounded corners (e.g., "T"-shaped intersection rounded corners 111a, 111h, first rounded corner 110a). The second inner sidewall 35b may define a shape of the second BCD layout area 104b including the rounded corners (e.g., "T"-shaped intersection rounded corners 111b, 111c, second cross-shaped intersection rounded corner 112b, rounded corner 110b). The second outer sidewall 37b may be equidistant from the second inner sidewall 35b around the second BCD layout area 104b, in which the second outer sidewall 37b has a same radius of curvature as the second inner sidewall 35b at the rounded corners (e.g., "T"-shaped intersection rounded corners 111b, 111c, rounded corner 110b). For example, the first rounded corner 110a may include the first inner sidewall 35a that has a first radius of curvature and may include the first outer sidewall 37a that has a radius of curvature equal to the first radius of curvature. Similarly, the rounded corner 110b may include the second inner sidewall 35b and the second outer sidewall 37b which may both have radii of curvature of equivalent values.

In some embodiments, the deep trench isolation structure 102 may have a distance D1, in which D1 may be a distance between (i) the first inner sidewall 35a and the first outer sidewall 37a, (ii) the second inner sidewall 35b and the second outer sidewall 37b, and (iii) the first inner sidewall 35a and the second inner sidewall 35b. In some embodiments, the distance D1 may be equal to 2 micrometers.

The "T"-shaped intersection 106a may include a first "T"-shaped intersection rounded corner 111a that defines a second corner of the first BCD layout area 104a, and a second "T"-shaped intersection rounded corner 111b that defines a first corner of the second BCD layout area 104b. The first "T"-shaped intersection rounded corner 111a may include the first inner sidewall 35a having a first radius of curvature and the first outer sidewall 37a having the same first radius of curvature, in which the first outer sidewall 37a may be equidistant from the first inner sidewall 35a. The second "T"-shaped intersection rounded corner 111b may include the second inner sidewall 35b having a second radius of curvature, and the second outer sidewall 37b having the same second radius of curvature, in which the second outer sidewall 37b may be equidistant from the second inner sidewall 35b. The first outer sidewall 37a and the second outer sidewall 37b may converge to a point between the first inner sidewall 35a and the second inner sidewall 35b. For example, the outer 37a, 37b may come to a convergence point within the middle of the "T"-shaped intersection 106a in order to maintain the distance D1 between the outer sidewalls 37a, 37b and the inner sidewalls 35a, 35b. After the convergence point and along a vertical portion of the deep trench isolation structure, the first inner sidewall 35a and the second inner sidewall 35b may maintain a distance D1.

With reference to FIGS. 1, 12C, and 12D, the deep trench isolation structure 102 may include inner sidewalls 35a, 35b, 35c, 35d and corresponding central node sidewalls 39a, 39b, 39c, 39d with dimensions defined by the dimensions of the previously etched deep trench 21. The first inner sidewall 35a may define the shape and perimeter of the first BCD layout area 104a, the second inner sidewall 35b may define the shape and perimeter of the second BCD layout area 104b, the third inner sidewall 35c may define the shape and perimeter of the third BCD layout area 104c, and the fourth inner sidewall 35d may define the shape and perimeter of the fourth BCD layout area 104d. For example, the first inner sidewall 35a may define a shape of the first BCD layout area 104a including the rounded corners (e.g., "T"-shaped intersection rounded corners 111a, 111h, first cross-shaped intersection rounded corner 112a, first rounded corner 110a).

The deep trench isolation structure 102 may include the first cross-shaped intersection rounded corner 112a that defines a corner of the first BCD layout area 104a, a second cross-shaped intersection rounded corner 112b that defines a corner of the second BCD layout area 104b, a third cross-shaped intersection rounded corner 112c that defines a corner of the third BCD layout area 104c, and a fourth cross-shaped intersection rounded corner 112d that defines a corner of the fourth BCD layout area 104d. The first cross-shaped intersection rounded corner 112a may include the first inner sidewall 35a having a third radius of curvature and a first central node sidewall 39a having the third radius of curvature. The second cross-shaped intersection rounded corner 112b may include the second inner sidewall 35b having a fourth radius of curvature, and a second central node sidewall 39b having the fourth radius of curvature. The third cross-shaped intersection rounded corner 112c may include the third inner sidewall 35c having a fifth radius of curvature, and a third central node sidewall 39c having the fifth radius of curvature. The fourth cross-shaped intersection rounded corner 112d may include the fourth inner sidewall 35d having a sixth radius of curvature, and a fourth central node sidewall 39d having the sixth radius of curvature, The first central node sidewall 39a may be equidistant from the first inner sidewall 35a around the central node 33, in which the first central node sidewall 39a may have a same radius of curvature as the first inner sidewall 35a at the first cross-shaped intersection rounded corner 112a. The second inner sidewall 35b may define a shape of the second BCD layout area 104b including the rounded corners (e.g., "T"-shaped intersection rounded corners 111b, 111c, second cross-shaped intersection rounded corner 112b, rounded corner 110b). The second central node sidewall 39b may be equidistant from the second inner sidewall 35b around the central node 33, in which the second central node sidewall 39b may have a same radius of curvature as the second inner sidewall 35b at the second cross-shaped intersection rounded corner 112b. The third inner sidewall 35c may define a shape of the third BCD layout area 104c including the rounded corners (e.g., "T"-shaped intersection rounded corners 111d, 111e, third cross-shaped intersection rounded corner 112c, rounded corner 110c). The third central node sidewall 39c may be equidistant from the third inner sidewall 35c around the central node 33, in which the third central node sidewall 39c may have a same radius of curvature as the third inner sidewall 35c at the third cross-shaped intersection rounded corner 112c. The fourth inner sidewall 35d may define a shape of the fourth BCD layout area 104d including the rounded corners (e.g., "T"-shaped intersection rounded corners 111f, 111g, fourth cross-shaped intersection rounded corner 112d, rounded corner 110d). The fourth central node sidewall 39d may be equidistant from the fourth inner sidewall 35d around the central node 33, in which the fourth central node sidewall 39d may have a same radius of curvature as the fourth inner sidewall 35d at the fourth cross-shaped intersection rounded corner 112d.

The deep trench isolation structure 102 may include the central node 33, which may be defined by the first central node sidewall 39a, the second central node sidewall 39b, the third central node sidewall 39c, and the fourth central node sidewall 39d. The first central node sidewall 39a and the second central node sidewall 39b may converge to a point between the first inner sidewall 35a and the second inner sidewall 35b. The second central node sidewall 39b and the third central node sidewall 39c converge to a point between the second inner sidewall 35b and the third inner sidewall 35c. The third central node sidewall 39c and the fourth central node sidewall 39d converge to a point between the third inner sidewall 35c and the fourth inner sidewall 35d. The fourth central node sidewall 39d and the first central node sidewall 39a converge to a point between the fourth inner sidewall 35d and the first inner sidewall 35a.

In some embodiments, the deep trench isolation structure 102 may have a distance D1, in which D1 may be a distance between (i) the first inner sidewall 35a and the second inner sidewall 35b, (ii) the second inner sidewall 35b and the third inner sidewall 35c, (iii) the third inner sidewall 35c and the fourth inner sidewall 35d, and (iv) the fourth inner sidewall 35d and the first inner sidewall 35a. In some embodiments, the distance D1 may be equal to 2 micrometers.

In some embodiments, the deep trench isolation structure 102 may have a distance D2, in which D2 may be a distance between directly opposing sidewalls around the central node 33. For example, D2 may be a distance between (i) the first inner sidewall 35a and the first central node sidewall 39a, (ii) the second inner sidewall 35b and the second central node sidewall 39b, (iii) the third inner sidewall 35c and the third central node sidewall 39c, and (iv) the fourth inner sidewall 35d and the fourth central node sidewall 39d. In some embodiments, the distance D2 may be less than 2 micrometers.

With reference to FIGS. 1, 12E, and 12F, the deep trench isolation structure 102 may include inner sidewalls 35c and 35d with dimensions defined by the dimensions of the previously etched deep trench 21. The third inner sidewall 35c may define the shape and perimeter of the third BCD layout area 104c, and the fourth inner sidewall 35d may define the shape and perimeter of the fourth BCD layout area 104d. For example, the third inner sidewall 35c may define a shape of the third BCD layout area 104c including the rounded corners (e.g., "T"-shaped intersection rounded corners 111d, 111e, third cross-shaped intersection rounded corner 112c, third rounded corner 110c). The deep trench isolation structure 102 may include the vertical portion 109 connecting the cross-shaped intersection 108 to the "T"-shaped intersection 106c.

Figure 13:
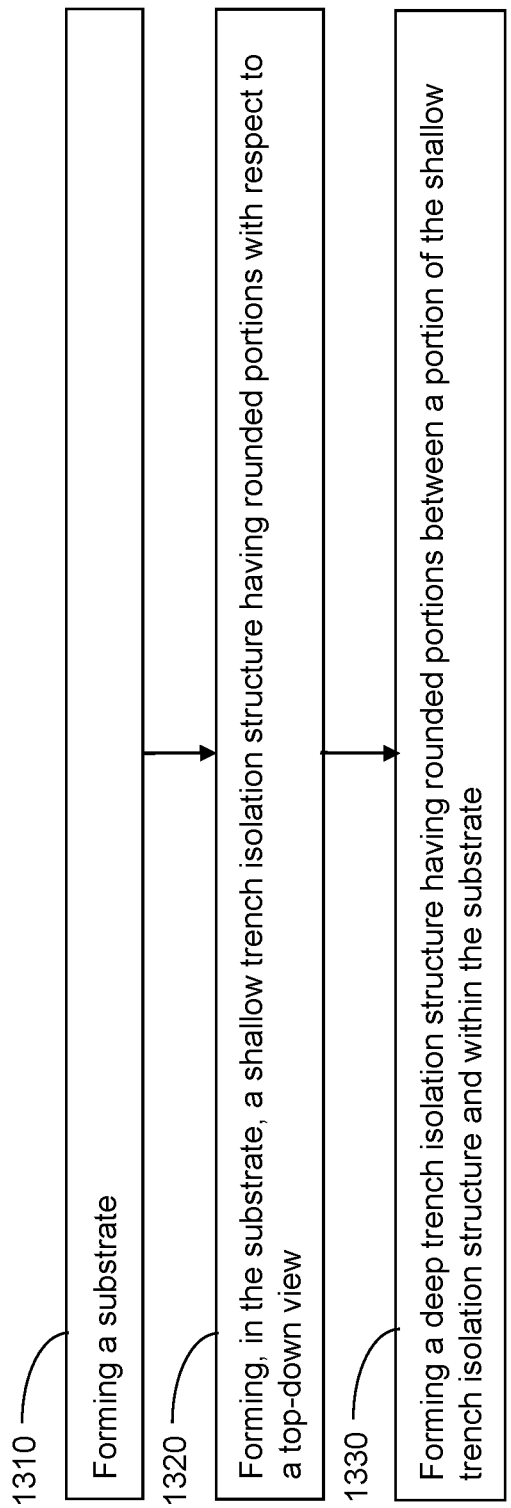
FIG. 13 is a flow chart illustrating a general sequence of processing steps that may be used to form a deep trench isolation structure of the present disclosure.

FIG. 13 is a flow chart illustrating a general sequence of processing steps that may be used to form a deep trench isolation structure 102 of the present disclosure. Referring to step 1310 and FIGS. 1 and 2A-2F, a substrate may be formed. Referring to step 1320 and FIGS. 3A-3F, a shallow trench isolation structure 14 having rounded portions with respect to a top-down view may be formed in the substrate 101. Referring to step 1330 and FIGS. 1 and 4A-12F, a deep trench isolation structure 102 having rounded portions may be formed between a portion of the shallow trench isolation structure 14 and within the substrate 101. In various embodiments, the deep trench isolation structure 102 may be formed to physically separate BCD layout areas (e.g., BCD layout areas 104a, 104b, 104c, 104d) of a BCD device.

In one embodiment, referring to all drawings, forming the deep trench isolation structure 102 having rounded portions, with respect to a top-down view, may include forming vertical portions of the deep trench isolation structure 102, forming horizontal portions of the deep trench isolation structure 102, forming a "T"-shaped intersection (e.g., "T"-shaped intersections 106a, 106b, 106c, 106d) of the deep trench isolation structure 102 connecting at least one vertical portion and at least one horizontal portion, and forming a cross-shaped intersection 108 of the deep trench isolation structure 102 connecting two vertical portions and two horizontal portions.

In one embodiment, referring to FIGS. 1 and 6A-6F, forming the vertical portions of the deep trench isolation structure 102 may further include etching vertical portions of a deep trench 21 having a width equal to 2 micrometers. In one embodiment, forming the horizontal portions of the deep trench isolation structure 102 may further include etching horizontal portions of the deep trench 21 having a width equal to 2 micrometers.

In one embodiment, referring to FIGS. 1, 6A, and 6B, forming the "T"-shaped intersection of the deep trench isolation structure 102 may further include etching a deep trench 21 including etching a first "T"-shaped intersection rounded corner 111a including a first inner sidewall 35a having a first radius of curvature and a first outer sidewall 37a having the first radius of curvature, and etching the deep trench 21 including etching a second "T"-shaped intersection rounded corner 111b including a second inner sidewall 35b having a second radius of curvature and a second outer sidewall 37b having the second radius of curvature, in which the first outer sidewall 37a and the second outer sidewall 37b converge to a point between the first inner sidewall and the second inner sidewall.

In one embodiment, referring to FIGS. 1, 6C, and 6D, forming the cross-shaped intersection 108 of the deep trench isolation structure 102 may further include etching a deep trench 21 around a central node 33 centrally positioned within an intersection of the two vertical portions and the two horizontal portions. In some embodiments, a distance between directly opposing sidewalls of the deep trench 21 around the central node may be less than 2 micrometers.

Referring to all drawings and according to various embodiments of the present disclosure, a semiconductor structure is provided. The semiconductor structure may include a first BCD device formed within a first perimeter of a first BCD layout area 104a, and a deep trench isolation structure 102 defining the first perimeter of the first BCD layout area 104a, in which the deep trench isolation structure 102 comprises a first rounded corner 110a that defines a first corner of the first BCD layout area 104a.

In one embodiment, the first rounded corner 110a may include a first inner sidewall 35a having a first radius of curvature and a first outer sidewall 37a having the first radius of curvature, in which the first outer sidewall 37a may be equidistant from the first inner sidewall 35a. In one embodiment, a distance between the first inner sidewall 35a and the first outer sidewall 37a may be 2 micrometers.

In one embodiment, the semiconductor structure may further include a second BCD device formed within a second perimeter of a second BCD layout area 104b, in which the deep trench isolation structure 102 may define the second perimeter of the second BCD layout area 104b and may be positioned between the first BCD layout area 104a and the second BCD layout area 104b. In one embodiment, the deep trench isolation structure 102 may include at least one "T"-shaped intersection that may couple portions of the deep trench isolation structure 102 located around the first BCD layout area 104a and the second BCD layout area 104b.

In one embodiment, the at least one "T"-shaped intersection may include a first "T"-shaped intersection rounded corner 111a that may define a second corner of the first BCD layout area 104a. The first "T"-shaped intersection rounded corner 111a may include a first inner sidewall 35a having a first radius of curvature, and a first outer sidewall 37a having the first radius of curvature, in which the first outer sidewall 37a may be equidistant from the first inner sidewall 35a. The at least one "T"-shaped intersection may further include a second "T"-shaped intersection rounded corner 111b that may define a first corner of the second BCD layout area 104b. The second "T"-shaped intersection rounded corner 111b may include a second inner sidewall 35b having a second radius of curvature, and a second outer sidewall 37b having the second radius of curvature, in which the second outer sidewall 37b may be equidistant from the second inner sidewall 35b, and in which the first outer sidewall 37a and the second outer sidewall 37b may converge to a point between the first inner sidewall 35a and the second inner sidewall 35b.

In one embodiment, the deep trench isolation structure 102 may further include a first cross-shaped intersection rounded corner 112a that may define a third corner of the first BCD layout area 104a, a second cross-shaped intersection rounded corner 112b that may define a second corner of a second BCD layout area 104b, a third cross-shaped intersection rounded corner 112c that may define a first corner of a third BCD layout area 104c, and a fourth cross-shaped intersection rounded corner 112d that may define a fourth corner of a fourth BCD layout area 104d. The deep trench isolation structure 102 may define a second perimeter of the second BCD layout area 104b, may define a third perimeter of the third BCD layout area 104c, and may define a fourth perimeter of the fourth BCD layout area 104d. The deep trench isolation structure 102 may be positioned between the first BCD layout area 104a, the second BCD layout area 104b, the third BCD layout area 104c, and the fourth BCD layout area 104d.

In one embodiment, the first cross-shaped intersection rounded corner 112a may include a first inner sidewall 35a having a third radius of curvature, and a first central node sidewall 39a having the third radius of curvature, in which the first central node sidewall 39a may be equidistant from the first inner sidewall 35a. In one embodiment, the second cross-shaped intersection rounded corner 112b may include a second inner sidewall 35b having a fourth radius of curvature, and a second central node sidewall 39b having the fourth radius of curvature, in which the second central node sidewall 39b may be equidistant from the second inner sidewall 35b. In one embodiment, the third cross-shaped intersection rounded corner 112c may include a third inner sidewall 35c having a fifth radius of curvature, and a third central node sidewall 39c having the fifth radius of curvature, in which the third central node sidewall 39c may be equidistant from the third inner sidewall 35c. In one embodiment, the fourth cross-shaped intersection rounded corner 112d may include a fourth inner sidewall 35d having a sixth radius of curvature, and a fourth central node sidewall 39d having the sixth radius of curvature, in which the fourth central node sidewall 39d may be equidistant from the fourth inner sidewall 35d.

In one embodiment, the deep trench isolation structure 102 may further include a central node 33 defined by the first central node sidewall 39a, the second central node sidewall 39b, the third central node sidewall 39c, and the fourth central node sidewall 39d, in which the first central node sidewall 39a and the second central node sidewall 39b may converge to a point between the first inner sidewall 35a and the second inner sidewall 35b, in which the second central node sidewall 39b and the third central node sidewall 39c may converge to a point between the second inner sidewall 35b and the third inner sidewall 35c, in which the third central node sidewall 39c and the fourth central node sidewall 39d may converge to a point between the third inner sidewall 35c and the fourth inner sidewall 35d, and in which the fourth central node sidewall 39d and the first central node sidewall 39a may converge to a point between the fourth inner sidewall 35d and the first inner sidewall 35a.

In one embodiment, a distance between the first inner sidewall 35a and the first central node sidewall 39a may be less than 2 micrometers, a distance between the second inner sidewall 35b and the second central node sidewall 39b may be less than 2 micrometers, a distance between the third inner sidewall 35c and the third central node sidewall 39c may be less than 2 micrometers, and a distance between the fourth inner sidewall 35d and the fourth central node sidewall 39d may be less than 2 micrometers.

In one embodiment, the deep trench isolation structure 102 may include a cross-shaped intersection 108 coupling portions of the deep trench isolation structure 102 that may be positioned between the first BCD layout area 104a and the second BCD layout area 104b, between the second BCD layout area 104b and the third BCD layout area 104c, between the third BCD layout area 104c and the fourth BCD layout area 104d, and between the fourth BCD layout area 104d and the first BCD layout area 104a.

In one embodiment, the deep trench isolation structure 102 may be a single, continuous deep trench structure that may physically separate and electrically isolate the first BCD layout area 104a, the second BCD layout area 104b, the third BCD layout area 104c, and the fourth BCD layout area 104d from each other.

Referring to all drawings and according to various embodiments of the present disclosure, a semiconductor structure is provided. The semiconductor structure may include a substrate 101, BCD device formed on the substrate 101, and a deep trench isolation structure 102 laterally surrounding the BCD device. The deep trench isolation structure 102, with respect to a top-down view, may include vertical portions, horizontal portions, a "T"-shaped intersection (e.g., 106a, 106b, 106c, 106d) connecting at least one vertical portion and at least one horizontal portion, and a cross-shaped intersection 108 connecting two vertical portions and two horizontal portions.

In one embodiment, the vertical portions, the horizontal portions, the "T"-shaped intersection (e.g., 106a, 106b, 106c, 106d), and the cross-shaped intersection 108 may physically separate a first BCD layout area 104a, a second BCD layout area 104b, a third BCD layout area 104c, and a fourth BCD layout area 104d. In one embodiment, the cross-shaped intersection 108 may include a central node 33 around which a deep trench 21 of the deep trench isolation structure 102 is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a first bipolar-CMOS-DMOS (BCD) device formed within a first perimeter of a first BCD layout area;
a second BCD device formed within a second perimeter of a second BCD layout area; and a deep trench isolation structure defining the first perimeter of the first BCD layout area and the second perimeter of the second BCD layout area, wherein the deep trench isolation structure is positioned between the first BCD layout area and the second BCD layout area and wherein the deep trench isolation structure comprises:
  a first rounded corner that defines a first corner of the first BCD layout area; and
  at least one "T"-shaped intersection coupling portions of the deep trench isolation structure located around the first BCD layout area and the second BCD layout area.

2. The semiconductor device of claim 1, wherein the first rounded corner comprises:
  a first inner sidewall having a first radius of curvature; and
  a first outer sidewall having the first radius of curvature.

3. The semiconductor device of claim 2, wherein a distance between the first inner sidewall and the first outer sidewall is 2 micrometers.

4. The semiconductor device of claim 1, wherein the at least one "T"-shaped intersection comprises:
  a first "T"-shaped intersection rounded corner that defines a second corner of the first BCD layout area, the first "T"-shaped intersection rounded corner comprising:
    a first inner sidewall having a first radius of curvature; and
    a first outer sidewall having the first radius of curvature; and
  a second "T"-shaped intersection rounded corner that defines a first corner of the second BCD layout area, the second "T"-shaped intersection rounded corner comprising:
    a second inner sidewall having a second radius of curvature; and
    a second outer sidewall having the second radius of curvature, wherein the first outer sidewall and the second outer sidewall converge to a point between the first inner sidewall and the second inner sidewall.

5. The semiconductor device of claim 1, wherein the deep trench isolation structure further comprises:
  a first cross-shaped intersection rounded corner that defines a third corner of the first BCD layout area;
  a second cross-shaped intersection rounded corner that defines a second corner of a second BCD layout area;
  a third cross-shaped intersection rounded corner that defines a first corner of a third BCD layout area; and
  a fourth cross-shaped intersection rounded corner that defines a fourth corner of a fourth BCD layout area;
  wherein the deep trench isolation structure defines, defines a third perimeter of the third BCD layout area, and defines a fourth perimeter of the fourth BCD layout area, and wherein the deep trench isolation structure is positioned between the first BCD layout area, the second BCD layout area, the third BCD layout area, and the fourth BCD layout area.

6. The semiconductor device of claim 5, wherein
the first cross-shaped intersection rounded corner comprises:
  a first inner sidewall having a third radius of curvature; and
  a first central node sidewall having the third radius of curvature;
the second cross-shaped intersection rounded corner comprises:
  a second inner sidewall having a fourth radius of curvature; and
  a second central node sidewall having the fourth radius of curvature;
the third cross-shaped intersection rounded corner comprises:
  a third inner sidewall having a fifth radius of curvature; and
  a third central node sidewall having the fifth radius of curvature;
the fourth cross-shaped intersection rounded corner comprises:
  a fourth inner sidewall having a sixth radius of curvature; and
  a fourth central node sidewall having the sixth radius of curvature; and
wherein the deep trench isolation structure further comprises:
  a central node defined by the first central node sidewall, the second central node sidewall, the third central node sidewall, and the fourth central node sidewall, wherein the first central node sidewall and the second central node sidewall converge to a point between the first inner sidewall and the second inner sidewall, wherein the second central node sidewall and the third central node sidewall converge to a point between the second inner sidewall and the third inner sidewall, wherein the third central node sidewall and the fourth central node sidewall converge to a point between the third inner sidewall and the fourth inner sidewall, and wherein the fourth central node sidewall and the first central node sidewall converge to a point between the fourth inner sidewall and the first inner sidewall.

7. The semiconductor device of claim 6, wherein a distance between the first inner sidewall and the first central node sidewall is less than 2 micrometers, wherein a distance between the second inner sidewall and the second central node sidewall is less than 2 micrometers, wherein a distance between the third inner sidewall and the third central node sidewall is less than 2 micrometers, and wherein a distance between the fourth inner sidewall and the fourth central node sidewall is less than 2 micrometers.

8. The semiconductor device of claim 6, wherein the first radius of curvature, second radius of curvature, third radius of curvature, fourth radius of curvature, fifth radius of curvature, and sixth radius of curvature are equal.

9. The semiconductor device of claim 5, wherein the deep trench isolation structure comprises:
  a cross-shaped intersection coupling portions of the deep trench isolation structure positioned between the first BCD layout area and the second BCD layout area, between the second BCD layout area and the third BCD layout area, between the third BCD layout area and the fourth BCD layout area, and between the fourth BCD layout area and the first BCD layout area.

10. The semiconductor device of claim 5, wherein the deep trench isolation structure is a single, continuous deep trench structure that physically separates and electrically isolates the first BCD layout area, the second BCD layout area, the third BCD layout area, and the fourth BCD layout area.

11. The semiconductor device of claim 1, wherein the deep trench isolation structure further comprises a doped well formed at a bottom of the deep trench isolation structure.

12. A semiconductor device, comprising:
  a substrate;
  a bipolar-CMOS-DMOS (BCD) device formed on the substrate; and a deep trench isolation structure laterally surrounding the BCD device, wherein the deep trench isolation structure, with respect to a top-down view, comprises:
vertical portions;
horizontal portions;
a "T"-shaped intersection connecting at least one vertical portion and at least one horizontal portion; and
a cross-shaped intersection connecting two vertical portions and two horizontal portions.

13. The semiconductor device of claim 12, wherein the vertical portions, the horizontal portions, the "T"-shaped intersection, and the cross-shaped intersection physically separate a first BCD layout area, a second BCD layout area, a third BCD layout area, and a fourth BCD layout area.

14. The semiconductor device of claim 12, wherein the cross-shaped intersection comprises a central node around which a deep trench of the deep trench isolation structure is formed.

15. A semiconductor device, comprising:
a substrate; and
a continuous deep trench isolation structure formed within the substrate and surrounding four portions of the substrate and central node portion of the substrate, wherein the central node portion is equidistant to proximate rounded corners of the four portions, wherein the continuous deep trench isolation structure comprises:
at least one "T"-shaped intersection coupling portions of the deep trench isolation structure located around two adjacent portions of the substrate.

16. The semiconductor device of claim 15, wherein the continuous deep trench isolation structure comprises:
a first deep trench isolation sidewall in contact with and surrounding sidewalls of a first substrate portion of the four portions;
a second deep trench isolation sidewall in contact with and surrounding sidewalls of a second substrate portion of the four portions;
a third deep trench isolation sidewall in contact with and surrounding sidewalls of a third substrate portion of the four portions; and
a fourth deep trench isolation sidewall in contact with and surrounding sidewalls of a fourth substrate portion of the four portions.

17. The semiconductor device of claim 16, the continuous deep trench structure further comprising:
a continuous polysilicon layer in contact with and surrounding the first deep trench isolation sidewall, the second deep trench isolation sidewall, the third deep trench isolation sidewall, and the fourth deep trench isolation sidewall.

18. The semiconductor device of claim 17, the continuous deep trench structure further comprising:
a continuous doped well positioned beneath the polysilicon layer and surrounding the first deep trench isolation sidewall, the second deep trench isolation sidewall, the third deep trench isolation sidewall, and the fourth deep trench isolation sidewall.

19. The semiconductor device of claim 15, wherein the continuous deep trench isolation structure comprises:
a deep trench isolation sidewall in contact with and surrounding sidewalls of the central node portion.

20. The semiconductor device of claim 15, wherein the central node portion includes four sidewalls that have a radius of curvature that is equal to a radius of curvature of the proximate rounded corners of the four portions.

* * * * *